(12) United States Patent
Rhodes

(10) Patent No.: US 10,712,661 B2
(45) Date of Patent: Jul. 14, 2020

(54) NEGATIVE TONE PHOTOSENSITIVE COMPOSITIONS

(71) Applicant: PROMERUS, LLC, Brecksville, OH (US)

(72) Inventor: Larry F Rhodes, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/621,059

(22) Filed: Jun. 13, 2017

(65) Prior Publication Data

US 2017/0357156 A1    Dec. 14, 2017

Related U.S. Application Data

(60) Provisional application No. 62/349,948, filed on Jun. 14, 2016.

(51) Int. Cl.

| | | |
|---|---|---|
| *G03F 7/025* | (2006.01) | |
| *G03F 7/027* | (2006.01) | |
| *G03F 7/028* | (2006.01) | |
| *G03F 7/032* | (2006.01) | |
| *G03F 7/40* | (2006.01) | |
| *G03F 7/038* | (2006.01) | |
| *G03F 7/033* | (2006.01) | |
| *G03F 7/029* | (2006.01) | |
| *G03F 7/32* | (2006.01) | |
| *C08F 220/12* | (2006.01) | |
| *C08F 220/26* | (2006.01) | |
| *G03F 7/004* | (2006.01) | |

(52) U.S. Cl.
CPC .......... *G03F 7/0382* (2013.01); *C08F 220/12* (2013.01); *C08F 220/26* (2013.01); *G03F 7/0045* (2013.01); *G03F 7/0046* (2013.01); *G03F 7/027* (2013.01); *G03F 7/029* (2013.01); *G03F 7/033* (2013.01); *G03F 7/325* (2013.01); *G03F 7/40* (2013.01)

(58) Field of Classification Search
CPC ...... G03F 7/0392; G03F 7/038; G03F 7/0381; G03F 7/0382; G03F 7/2004; G03F 7/2006; G03F 7/30; G03F 7/025; G03F 7/027; G03F 7/028; G03F 7/031; G03F 7/40
USPC ...... 430/270.1, 281.1, 288.1, 905, 910, 323, 430/325
See application file for complete search history.

(56) References Cited

U.S. PATENT DOCUMENTS

| | | | | |
|---|---|---|---|---|
| 5,910,394 | A | 6/1999 | Shelnut | |
| 7,160,669 | B2 * | 1/2007 | Yamada | C07C 381/12 430/270.1 |
| 8,415,085 | B2 * | 4/2013 | Hada | C07C 309/12 430/270.1 |
| 8,753,790 | B2 * | 6/2014 | Onishi | C08G 61/08 430/190 |
| 2004/0253548 | A1 | 12/2004 | Endo et al. | |
| 2009/0035696 | A1 | 2/2009 | Matsuoka | |
| 2011/0036591 | A1 * | 2/2011 | George | E21B 21/001 166/373 |
| 2011/0070543 | A1 | 3/2011 | Knapp et al. | |
| 2011/0300484 | A1 * | 12/2011 | Yamato | C07C 317/04 430/281.1 |
| 2013/0181199 | A1 | 7/2013 | Apanius et al. | |

OTHER PUBLICATIONS

Larry F. Rhodes, Written Opinion of the ISA, PCT/US2017/037138, WO2017/218459 A1, dated Dec. 21, 2017.

* cited by examiner

*Primary Examiner* — John S Chu
(74) *Attorney, Agent, or Firm* — Balaram Gupta

(57) ABSTRACT

Various compositions encompassing polymers containing acidic pendent groups in combination with one or more reactive olefinic compounds and a photoacid generators form self-imagable negative tone films. Examples of such polymers include polymers and copolymers containing norbornene-type repeating units having acidic pendent groups, ring opened maleic anhydride polymers, polyacrylic acid, polyhydroxystyrene polymers, and the like. The films formed from such compositions provide self imagable, low-k, thermally stable layers for use in microelectronic and optoelectronic devices, among other applications.

18 Claims, 6 Drawing Sheets

NEGATIVE TONE PHOTOSENSITIVE COMPOSITIONS

CROSS REFERENCE TO RELATED APPLICATIONS

This application claims the benefit of U.S. Provisional Application No. 62/349,948, filed Jun. 14, 2016, which is incorporated herein by reference in its entirety.

BACKGROUND OF THE INVENTION

Field of the Invention

Various polymers containing acidic pendent groups and compositions thereof useful for forming self-imagable films are disclosed. Such compositions include polymers having norbornene-type repeating units containing acidic pendent groups, including carboxylic acid pendent groups, phenolic pendent groups, ring opened maleic anhydride repeat units, sulfonic acid pendent group, sulfonamide pendent groups, and polyhydroxystyrene polymers, and the like. The compositions further encompass one or more reactive olefinic compound and a photoacid generator. The films formed from such polymer compositions provide photo imagable, low-k, thermally stable layers for use in microelectronic and opto-electronic devices.

Description of the Art

As the microelectronic devices are fabricated in smaller geometries there is an increasing demand for advanced materials that meet the stringent requirements of confined smaller geometries. In particular, sub-micron device geometries have become common place in the fabrication of a variety of microelectronics packages for memory and logic integrated circuits (ICs), liquid crystal displays (LCDs), organic light emitting diodes (OLEDs) and other radio frequency (Rf) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated with submicron dimensions.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-k) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

Generally, such fabrication methods make use of certain polymers having photosensitive properties thereby various compositions that are suitable for aforementioned electronic or optoelectronic applications can be formed. See, for example, U.S. Pat. Nos. 8,748,074 and 8,753,790, pertinent portions of which are incorporated herein, where it is disclosed norbornene-type repeat units having pendent phenol groups are useful in certain microelectronic applications, which are generally positive tone photo-imagable compositions, and are not suitable for forming negative tone images.

Accordingly, it is an object of this invention to provide a series of compositions which are suitable as negative tone photo-imagable compositions.

Other objects and further scope of the applicability of the present invention will become apparent from the detailed description that follows.

SUMMARY OF THE INVENTION

It has surprisingly been found that various polymers containing pendent acidic groups react with an olefinic compound when subjected to a suitable "imagewise" actinic radiation in the presence of a photoacid generator thereby forming an insoluble addition product (e.g., crosslinked) thus forming negative tone images when subjected to a suitable developing medium after such "imagewise" actinic exposure. The images thus formed are of sub-micron size suitable for fabricating various electronic and opto-electronic devices as enumerated hereinabove.

Accordingly, there is provided a negative tone photoimagable composition comprising:

a) a polymer having a pendent acidic group of the formula (I):

where A is a monomeric repeat unit and Y is a pendent acidic group selected from phenolic hydroxyl group, carboxylic acid group and a sulfonic acid group;

b) one or more compounds selected from the group consisting of a compound of formula (II), a compound of formula (III) and a compound of formula (IV):

(II)

(III)

(IV)

wherein z is an integer from 1 to 5;

a is an integer from 1 to 3;

M and $M_1$ are the same or different and independently of each other selected from the group consisting of substituted or unsubstituted ($C_2$-$C_8$)alkenyl, ($C_3$-$C_8$)cycloalkenyl, ($C_7$-$C_{12}$)bicycloalkenyl and ($C_7$-$C_{12}$)tricycloalkenyl where said substituents are selected from ($C_1$-$C_6$)alkyl, ($C_1$-$C_6$)alkoxy, ($C_2$-$C_6$)alkenyl, ($C_3$-$C_8$)cycloalkenyl, ($C_7$-$C_{12}$)bicycloalkenyl, ($C_1$-$C_6$)alkoxy($C_3$-$C_6$)alkenyl, ($C_1$-$C_6$)alkoxy($C_3$-$C_8$)cycloalkenyl and ($C_1$-$C_6$)alkoxy($C_7$-$C_{12}$)bicycloalkenyl;

B and $B_1$ are the same or different and independently of each other is a bond or a divalent group selected from the group consisting of $(CZ_2)_b$, $(CZ_2O)_b$, $(CZ_2S)_b$, $(OCZ_2)_b$, $(SCZ_2)_b$, $(CH_2)_b$—(CH=CH)$_c$—$(CH_2)_b$, $(CH_2)_b$—O—$(CH_2)_b$, $(CH_2)_b$—$C_6Q_{10}$-$(CH_2)_b$ and $(CH_2)_b$—$C_6Q_4$-$(CH_2)_b$, where each b is independently an integer from 0 to 12, c is an integer from 1-6, Z is independently H or F, $C_6Q_{10}$ is divalent cyclohexylene that is substituted with Q, $C_6Q_4$ is divalent phenylene that is substituted with Q, where Q is independently selected from H, F, $CH_3$, $CF_3$ and $OCH_3$;

X is a bond or a group selected from the group consisting of O, S, $NR_1$, $SiR_2R_3$, —$(CZ_2)_b$—, —C(O)—, —C(O)O—, —OC(O)—, —OC(O)—O—, —S—C(O)—, —C(O)—S—, —CH=CH— and —C≡C—, —$C_6Q_4$-C(O)—$C_6Q_4$- and —OC(O)—C$_6$Q$_4$-C(O)O—, where Z and b are as defined above and R$_1$, R$_2$ and R$_3$ are independently of each other H, methyl, ethyl or a linear or branched (C$_3$-C$_{12}$)alkyl group and such that O, NR$_1$ and/or S atoms are not linked directly to one another;

D is selected from the group consisting of ethyl, a fluorinated or perfluorinated methyl or ethyl, a linear or branched (C$_3$-C$_{25}$)hydrocarbyl, a linear or branched fluorinated or perfluorinated (C$_3$-C$_{25}$)hydrocarbyl group, and substituted or unsubstituted (C$_6$-C$_{18}$)cyclic or polycyclic hydrocarbyl group; and c) a photoacid generator.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

DETAILED DESCRIPTION OF THE INVENTION

Figure 1:
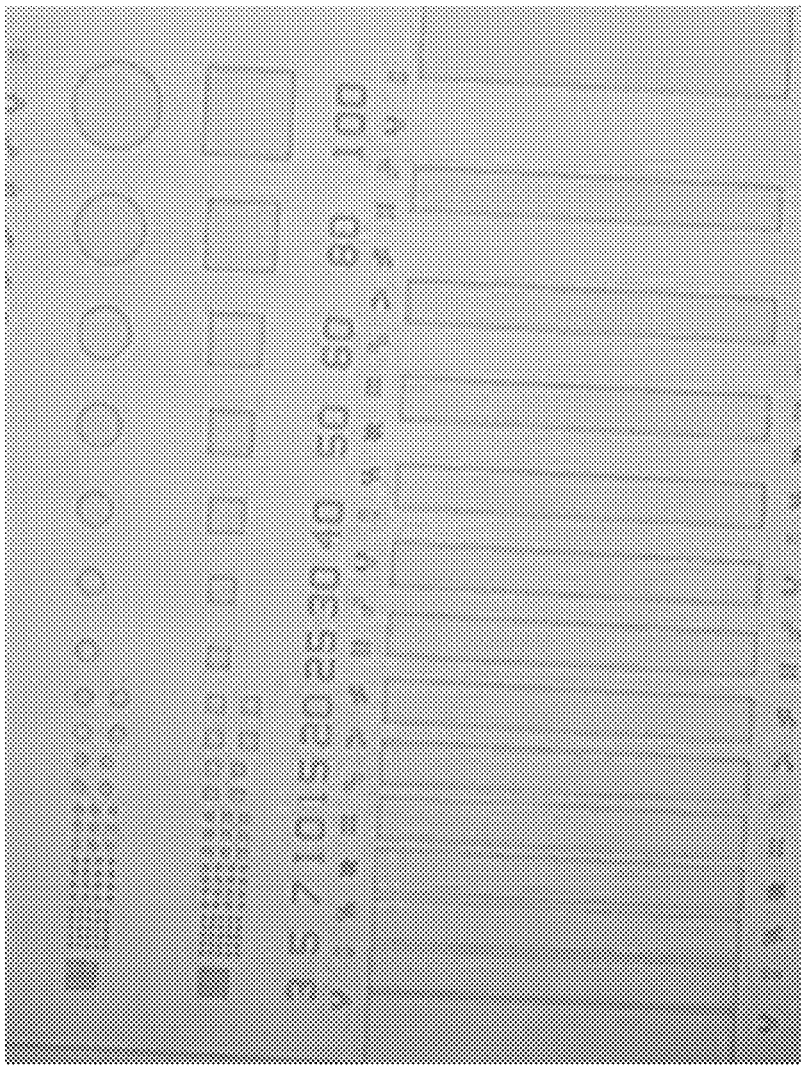
FIG. 1 shows an optical micrograph of a negative tone lithographic images of line and space pattern obtained from a composition embodiment of this invention.

Embodiments in accordance with the present invention are directed to various compositions, including but not limited to, polymers that encompass at least one repeating unit of formula (I) containing an acidic pendent group as described herein, at least one reactive olefinic compound of formulae (II), (III) or (IV) as described herein and at least one photoacid generator. Such compositions being capable of forming self-imagable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "$\sim\!\!\sim\!\!\sim$" denotes a position at which the bonding takes place with another repeat unit or another atom or molecule or group or moiety as appropriate with the structure of the group as shown.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen. The term "heterohydrocarbyl" refers to a hydrocarbyl group where at least one hydrogen has been replaced by a heteroatom. Examples of such heteroatoms include but not limited to O, S, N, Si, P, and the like.

As used herein, the expression "(C$_1$-C$_{15}$)alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "(C$_1$-C$_{15}$)alkoxy", "(C$_1$-C$_{15}$)thioalkyl" "(C$_1$-C$_{15}$)alkoxy(C$_1$-C$_{15}$)alkyl", "hydroxy(C$_1$-C$_{15}$)alkyl", "(C$_1$-C$_{15}$)alkylcarbonyl", "(C$_1$-C$_{15}$)alkoxycarbonyl(C$_1$-C$_{15}$)alkyl", "(C$_1$-C$_{15}$)alkoxycarbonyl", "amino(C$_1$-C$_{15}$)alkyl", "(C$_1$-C$_{15}$)alkylamino", "(C$_1$-C$_{15}$)alkylcarbamoyl(C$_1$-C$_{15}$)alkyl", "(C$_1$-C$_{15}$)dialkylcarbamoyl(C$_1$-C$_{15}$)alkyl" "mono- or di-(C$_1$-C$_{15}$)alkylamino(C$_1$-C$_{15}$)alkyl", "amino(C$_1$-C$_{15}$)alkylcarbonyl" "diphenyl(C$_1$-C$_{15}$)alkyl", "phenyl(C$_1$-C$_{15}$)alkyl", "phenylcarboyl(C$_1$-C$_{15}$)alkyl" and "phenoxy(C$_1$-C$_{15}$)alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "(C$_2$-C$_6$)alkenyl" includes ethenyl and straight-chained or branched propenyl, butenyl, pentenyl and hexenyl groups. Similarly, the expression "(C$_2$-C$_6$)alkynyl" includes ethynyl and propynyl, and straight-chained or branched butynyl, pentynyl and hexynyl groups.

As used herein, the expression "(C$_1$-C$_{15}$)perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_{15})$perfluoroalkoxy", is to be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$alkoxy, $(C_1-C_6)$thioalkyl, $(C_1-C_6)$perfluoroalkoxy, —$NH_2$, Cl, Br, I, F, —$NH(C_1-C_6)$alkyl, and —$N((C_1-C_6)$alkyl$)_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

As used herein, the terms "polymer composition," or "copolymer composition" are used herein interchangeably and are meant to include at least one synthesized polymer or copolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornene-type monomers, in accordance with formula (I) wherein the resulting polymers are formed by 2,3 enchainment of norbornene-type monomers:

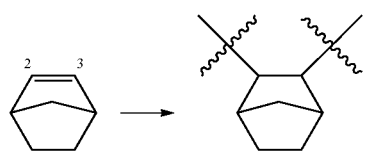

The term "low-k" refers in general to a dielectric constant less than that of thermally formed silicon dioxide (3.9) and when used in reference to a "low-k material" it will be understood to mean a material having a dielectric constant of less than 5.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray and electron beam source. Non-limiting examples of suitable materials that "photonically form catalyst" include photoacid generators such as are discussed in detail below. It should also be noted that generally "a material that photonically forms a catalyst" will also form a catalyst if heated to an appropriate temperature. Such exposures are sometimes desirable after developing a negative tone image and to fix the images post developing by blanket exposure to a suitable radiation.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Accordingly, there is provided a negative tone photoimagable composition comprising:

a) a polymer having a pendent acidic group of the formula (I):

where A is a monomeric repeat unit and Y is a pendent acidic group selected from phenolic hydroxyl group, carboxylic acid group and a sulfonic acid group;

b) one or more compounds selected from the group consisting of a compound of formula (II), a compound of formula (III) and a compound of formula (IV):

$$M\text{-}B\text{—}(X)_z\text{—}B_1\text{-}M_1 \tag{II}$$

$$H_{4-a}\text{—}C(B\text{-}M)_a \tag{III}$$

$$D\text{-}M \tag{IV}$$

wherein z is an integer from 1 to 5;

a is an integer from 1 to 3;

M and $M_1$ are the same or different and independently of each other selected from the group consisting of substituted or unsubstituted $(C_2\text{-}C_8)$alkenyl, $(C_3\text{-}C_8)$cycloalkenyl, $(C_7\text{-}C_{12})$bicycloalkenyl and $(C_7\text{-}C_{12})$tricycloalkenyl where said substituents are selected from $(C_1\text{-}C_6)$alkyl, $(C_1\text{-}C_6)$alkoxy, $(C_2\text{-}C_6)$alkenyl, $(C_3\text{-}C_8)$cycloalkenyl, $(C_7\text{-}C_{12})$bicycloalkenyl, $(C_1\text{-}C_6)$alkoxy$(C_3\text{-}C_6)$alkenyl, $(C_1\text{-}C_6)$alkoxy$(C_3\text{-}C_8)$cycloalkenyl and $(C_1\text{-}C_6)$alkoxy$(C_7\text{-}C_{12})$bicycloalkenyl;

B and $B_1$ are the same or different and independently of each other is a bond or a divalent group selected from the group consisting of $(CZ_2)_b$, $(CZ_2O)_b$, $(CZ_2S)_b$, $(CH_2)_b$—$(CH{=}CH)_c$—$(CH_2)_b$, $(CH_2)_b$—$O$—$(CH_2)_b$, $(CH_2)_b$—$C_6Q_{10}$-$(CH_2)_b$ and $(CH_2)_b$—$C_6Q_4$-$(CH_2)_b$, where each b is independently an integer from 0 to 12, c is an integer from 1-6, Z is independently H or F, $C_6Q_{10}$ is divalent cyclohexylene that is substituted with Q, $C_6Q_4$ is divalent phenylene that is substituted with Q, where Q is independently selected from H, F, $CH_3$, $CF_3$ and $OCH_3$;

X is a bond or a group selected from the group consisting of O, S, $NR_1$, $SiR_2R_3$, —$(CZ_2)_b$—, —$C(O)$—, —$C(O)O$—, —$OC(O)$—, —$OC(O)$—$O$—, —$S$—$C(O)$—, —$C(O)$—$S$—, —$CH{=}CH$— and —$C{\equiv}C$—, —$C_6Q_4$-$C(O)$—$C_6Q_4$- and —$OC(O)$—$C_6Q_4$-$C(O)O$—, where Z and b are as defined above and $R_1$, $R_2$ and $R_3$ are independently of each other H, methyl, ethyl or a linear or branched $(C_3\text{-}C_{12})$alkyl group and such that O, $NR_1$ and/or S atoms are not linked directly to one another;

D is selected from the group consisting of ethyl, a fluorinated or perfluorinated methyl or ethyl, a linear or branched $(C_3\text{-}C_{25})$hydrocarbyl, a linear or branched fluorinated or perfluorinated $(C_3\text{-}C_{25})$hydrocarbyl group, and substituted or unsubstituted $(C_6\text{-}C_{18})$cyclic or polycyclic hydrocarbyl group; and c) a photoacid generator.

It should be noted that any of the polymers which carry a pendent acidic group of the formula (I) can be used in combination with one or more of the compounds of formulae (II), (III) or (IV) in order to form the compositions in accordance with this invention. It is envisioned that the acidic group reacts with one or more of the olefinic functional group contained in the compounds of formula (II), (III) or (IV) in order to form an addition compound when exposed to suitable actinic radiation in the presence of a photoacid generator as shown in Scheme I, where such addition reaction is illustrated with a representative compound of formula (II), where M and $M_1$ are both $C_3$-alkenyl group, resulting in an addition product A. Accordingly, any of the polymers which contain a pendent acidic groups that brings about such an addition reaction can be employed in this invention.

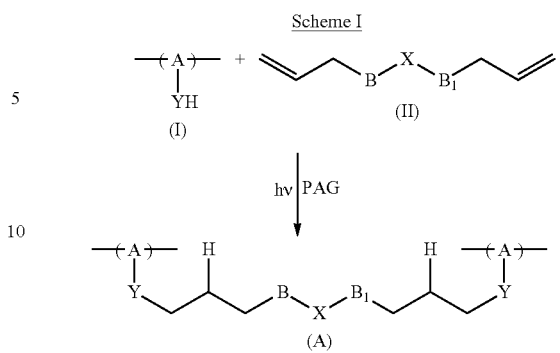

Scheme I

However, it should be understood that this invention works equally well with any of the mono-functional reactive olefinic compounds within the scope of the compounds of formulae (III) or (IV). For example, a compound of formula (III), where a is 1 or any of the compound of formula (IV) will have only one olefinic bond. In such situations the reaction between polymer of formula (I) and aforementioned compounds of formulae (III) or (IV), where M is $C_3$-alkenyl would result in an addition product, C or $C_1$, when exposed to suitable actinic radiation, as shown in Scheme II.

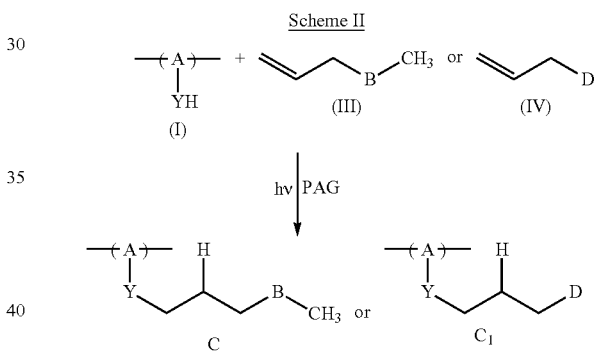

Scheme II

Advantageously, under these circumstances the starting polymer is aqueous base soluble and the resulting addition product after actinic radiation is base insoluble, i.e., the exposed negative tone images are insoluble in base. Accordingly, the compositions of this inventions can be readily developed using any of the commonly used aqueous base developers as further described hereinbelow. At the same time, the compositions of this invention can also be used with any of the organic solvents as both carrier solvents and as developing solvents as is commonly used in the art.

In general, it is envisioned that any polymer with an acidic pendent group having a pKa of about ten or less is suitable to form the compositions of this invention. In some embodiments the pKa of the acidic pendent group is in the range from about 1 to 10, in some other embodiments the pKa of the acidic pendent group is from about 3 to 8. Examples of such acidic pendent group include without any limitation substituted or unsubstituted phenolic pendent group, carboxylic acid pendent group, sulfonic acid pendent group, sulfonamide pendent group, and the like. Substituted phenolic pendent group which is substituted with electronic withdrawing groups such as halogen, CN, halogenated or perhalogenated alkyl groups is more acidic than the unsubstituted phenolic pendent group. On the other hand, electron donating substituent such as alkyl or alkoxy group results in lesser acidity of the pendent phenolic group. Accordingly, any of the polymers containing suitably substituted phenolic pendent group with a pKa of less than ten are suitable for forming the compositions of this invention.

Broadly speaking classes of polymers of formula (I) include without any limitation all known homo- and copolymers of polyacrylic acid, polymethacrylic acid, poly(hydroxystyrene), polynorbornenes containing pendent phenolic, carboxylic acid, hydroxy, sulfonic acid and sulfamic acid and sulfonamide groups, and polymers having the repeat units of ring opened maleic anhydride groups, among other polymers.

Similarly, any of the olefinic compounds of formulae (II), (III) or (IV) which reacts with a polymer of formula (I) can be used in forming the compositions of this invention. In general, the compositions of this invention are suitable in a variety of electronic applications where temperatures in excess of 150° C. or higher or employed. Accordingly, a compound of formulae (II), (III) or (IV) should withstand such high temperature operations. More suitably, as further discussed in detail below, the composition of this invention is first applied on to a suitable substrate and then post apply baked to remove the solvent, generally in the temperature range of from about 80 to 150° C. Accordingly, it is very desirable that the compound of formulae (II), (III) or (IV) present in the composition of this invention does not evaporate under those conditions. Thus, it is desirable that the vapor pressure of the compounds of formulae (II), (III) or (IV) is generally lower than the vapor pressure of the solvents that are employed to form the compositions of this invention.

Advantageously, it has now been found that the compounds of formulae (II), (III) or (IV) featuring low vapor pressure than some of the solvents employed are more suitable in the compositions of this invention. Typically the solvents employed herein as further discussed in detail below may have vapor pressures as low as 0.5 mm Hg at room temperature. For example, propylene glycol methyl ether acetate (PGMEA) has a vapor pressure of 3.7 mm Hg at 20° C. and γ-butyrolactone (GBL) has a vapor pressure of 1.5 mm Hg at 20° C. Therefore, it is advantageous to use a compound of formulae (II), (III) or (IV) which has a vapor pressure less than the vapor pressure of the solvent employed herein such that any step that requires removal of solvent post-coating of the composition onto a substrate and pre-exposure to actinic radiation does not also remove the compound of formulae (II), (III) or (IV). Accordingly, in some embodiments the vapor pressure of the compound of formulae (II), (III) or (IV) is less than 5 mm Hg at ambient room temperatures, such as for example, in the temperature range of 20 to 25° C. In some other embodiments the vapor pressure of the compound of formulae (II), (III) or (IV) is less than 1 mm Hg at ambient room temperatures, such as for example in the temperature range of 20 to 25° C. It should be noted further that olefinic monomers such as for example norbornene which has a vapor pressure of 39 mm Hg at 25° C. and norbornadiene which has a vapor pressure of 25 mm Hg at 25° C. are not suitable to be used as reactive olefinic monomers in place of one or more compounds of formulae (II), (III) or (IV).

As mentioned above, the polymer compositions of this invention further contains a photoacid generator (PAG). Any of the PAGs known to one skilled in the art which would bring about the desired results as further discussed hereinabove and hereinafter can be employed in the composition of this invention. Broadly speaking, the PAG that can be employed in this invention is ionic or non-ionic compound which when exposed to suitable radiation releases free acid.

Non-limiting examples of polymers of formula (I) that can be employed in the composition of this invention are selected from the group consisting of:

a) a polymer comprising a repeating unit of formula (Ia):

b) a polymer comprising a repeating unit of formula (Ib) derived from a monomer of formula (IB):

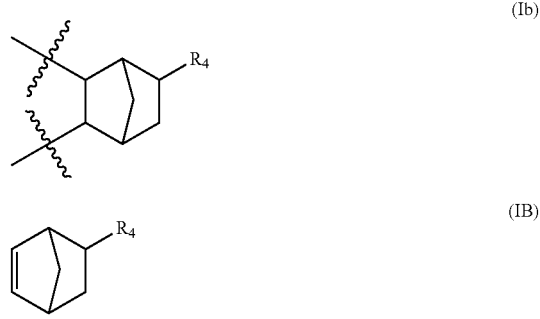

wherein ⌇ represents a position at which the bonding takes place with another repeat unit;

$R_4$ is selected from —$(CH_2)_v$—$CO_2R_{4a}$, —$(CH_2)_v$—Ar—OH, —$(CH_2)_v$—C(O)—Ar—OH, —$(CH_2)_v$—OC(O)—Ar—OH, —$(CH_2)_v$—C(O)O—Ar—OH, —C(O)O$(CH_2)_v$—Ar—OH, —$(CH_2)_v$—NHC(O)—Ar—OH, —C(O)NH$(CH_2)_v$—Ar—OH, —$(CH_2)_v$—O—Ar—OH, and —CH—(Ar—OH)$_2$ where each v is independently an integer from 0 to 4, and $R_{4a}$ is hydrogen or ($C_1$-$C_4$)alkyl, Ar is substituted or unsubstituted phenyl or naphthyl where substituents if present are selected from halogen, ($C_1$-$C_4$)alkyl, fluorinated or perfluorinated ($C_1$-$C_4$)alkyl, ($C_1$-$C_4$)alkoxy and fluorinated or perfluorinated ($C_1$-$C_4$)alkoxy; and c) a polymer comprising one or more distinctive monomer repeating units of formula (Ic) derived from a monomer of formula (IC) and maleic anhydride-type repeating units of formulae (Id1) and (Id2) derived from a maleic anhydride monomer of formula (ID):

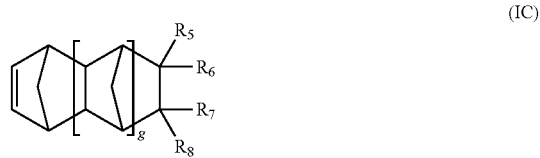

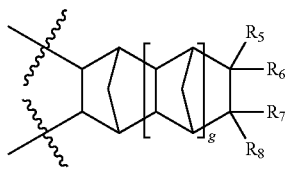

wherein:

∿∿ represents a position at which the bonding takes place with another repeat unit;

g is an integer from 0 to 2;

$R_5$, $R_6$, $R_7$ and $R_8$ are the same or different and independently of each other selected from the group consisting of hydrogen, methyl, ethyl, a fluorinated or perfluorinated methyl or ethyl, a linear or branched substituted or unsubstituted ($C_3$-$C_{25}$)hydrocarbyl group, substituted or unsubstituted ($C_1$-$C_{25}$)heterohydrocarbyl group, substituted or unsubstituted ($C_3$-$C_{25}$)cyclic hydrocarbyl group, substituted or unsubstituted ($C_6$-$C_{25}$)polycyclic hydrocarbyl group, substituted or unsubstituted ($C_3$-$C_{25}$)cyclic heterohydrocarbyl group and substituted or unsubstituted ($C_6$-$C_{25}$)polycyclic heterohydrocarbyl group;

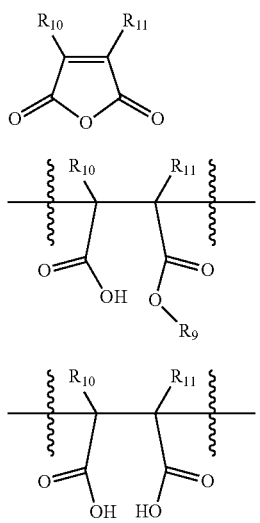

wherein:

∿∿ represents a position at which the bonding takes place with another repeat unit;

$R_9$ is selected from the group consisting of hydrogen, methyl, ethyl, a fluorinated or perfluorinated methyl or ethyl, a linear or branched ($C_3$-$C_9$)hydrocarbyl, a linear or branched fluorinated or perfluorinated ($C_3$-$C_9$)hydrocarbyl group, and substituted or unsubstituted ($C_6$-$C_{18}$)cyclic or polycyclic hydrocarbyl group;

$R_{10}$ and $R_{11}$ are the same or different and are selected from hydrogen, methyl, ethyl, a fluorinated or perfluorinated methyl or ethyl and a linear or branched ($C_3$-$C_9$)hydrocarbyl.

More specifically, as to the first class of polymers containing a repeat unit of formula (Ia), various poly(para-hydroxystyrene) polymers are known in the literature, and all of such polymers can be employed in the compositions of this invention. See, for example, U.S. Pat. No. 4,898,916, which discloses a process for the preparation of homopolymers of poly(para-hydroxystyrene) from poly(para-acetoxystyrene). Various copolymers containing the repeat unit of formula (Ia) are disclosed in U.S. Pat. Nos. 4,877,843 and 4,857,601, pertinent portions of which are incorporated herein by reference.

Now turning to polymers containing repeat units of formula (Ib), various homo- and copolymers of such types are reported in literature and all of such polymers can be employed in the compositions of this invention. See, for example, U.S. Pat. No. 9,341,949 discloses a wide variety of pendent acid group containing norbornene polymers, pertinent portions of which are incorporated herein by reference. Other acidic pendent group containing norbornene polymers are also disclosed in U.S. Pat. No. 8,748,074, pertinent portions of which are incorporated herein by reference.

Finally, polymers containing the repeat units of formula (Ic) with ring opened maleic anhydride repeat units of formulae (Id1) and (Id2) are disclosed in U.S. Pat. No. 8,715,900, pertinent portions of which are incorporated herein by reference.

As noted, any of the compounds of formula (II) can be used in the compositions of this invention. Accordingly, in some embodiments, the composition of this invention encompasses a compound of formula (II), which is selected from the group consisting of:

a) a compound of formula (IIa):

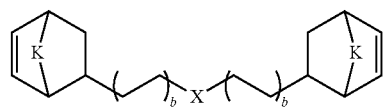

where

K is selected from $CH_2$, $CH_2$—$CH_2$, O and S;

X is O, S, $NR_1$, $SiR_2R_3$, —$(CZ_2)_b$— where Z and b are as defined above, —C(O)—, —C(O)O—, —OC(O)—, —OC(O)—O—, —S—C(O)—, —C(O)—S—, —CH=CH— or —C≡C— where $R_1$, $R_2$ and $R_3$ are as defined in claim 1; and b is an integer from 1 to 6;

b) a compound of formula (IIb):

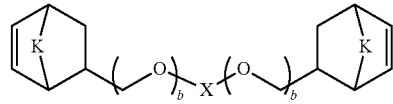

where

K is selected from $CH_2$, $CH_2$—$CH_2$, O and S;

X is $SiR_2R_3$, —$(CZ_2)_b$— where Z is hydrogen, —C(O)—, —CH=CH— or —C≡C— where $R_2$ and $R_3$ are as defined in claim 1; and b is an integer from 1 to 6;

c) a compound of formula (IIc):

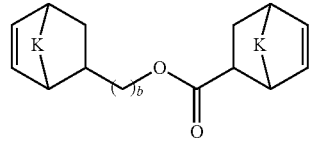

where
b is an integer from 1 to 6; and
K is selected from CH$_2$, CH$_2$—CH$_2$, O and S;
d) a compound of formula (IId):

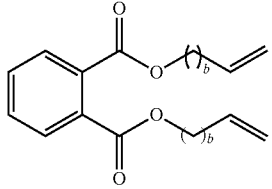
(IId)

where b is an integer from 1 to 6;
e) a compound of formula (IIe):

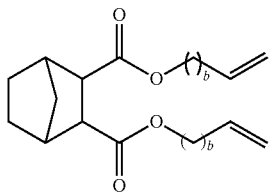
(IIe)

where b is an integer from 1 to 6;
f) a compound of formula (IIf):

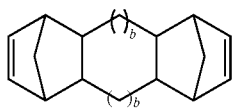
(IIf)

where b is an integer from 0 to 5;
g) a compound of formula (IIg):

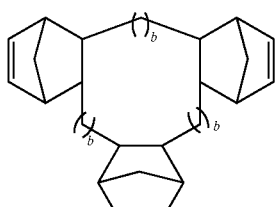
(IIg)

where b is an integer from 0 to 5;
h) a compound of formula (IIh):

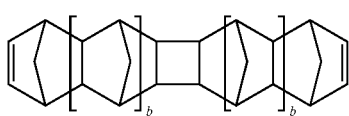
(IIh)

where b is an integer from 0 to 5;
i) a compound of formula (IIi):

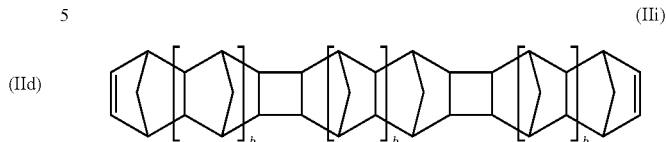
(IIi)

where b is an integer from 0 to 5;
j) a compound of formula (IIj):

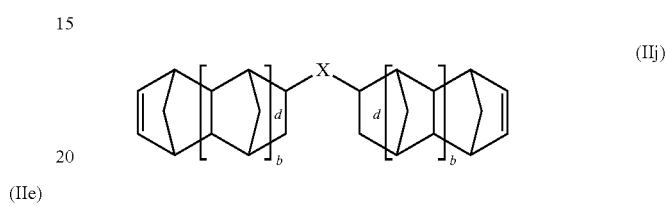
(IIj)

where b is an integer from 0 to 5, d is independently a single bond or double bond, and
X is as defined above.

Non-limiting examples of the compound of formula (II) maybe selected from the group consisting of:

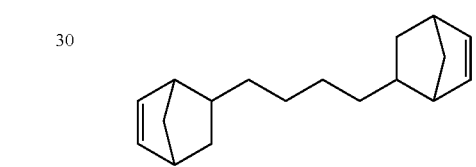

1,4-di(bicyclo[2.2.1]hept-5-en-2-yl)butane

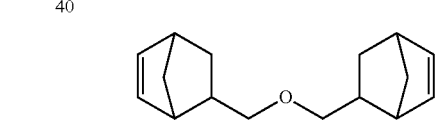

5,5'-(oxybis(methylene))bis(bicyclo[2.2.1]hept-2-ene)

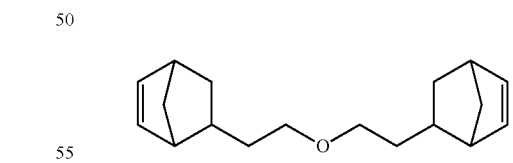

5,5'-(oxybis(ethane-2,1-diyl))bis(bicyclo[2.2.1]hept-2-ene)

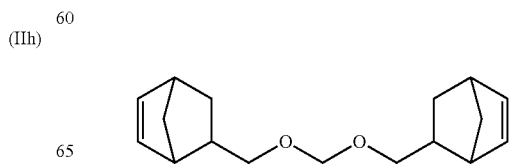

| 15 | 16 |
|---|---|
| bis(bicyclo[2.2.1]hept-5-en-2-ylmethoxy)methane | 1,3-bis(bicyclo[2.2.1]hept-5-en-2-ylmethoxy)propane |

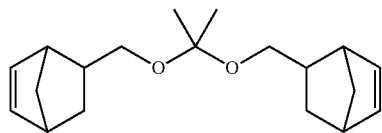 [SMILES: CC(C)(OCC1CC2C=CC1C2)OCC1CC2C=CC1C2]
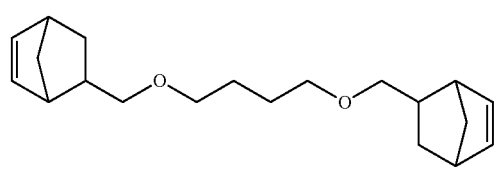

5,5'-((propane-2,2-diylbis(oxy))bis(methylene))bis(bicyclo[2.2.1]hept-2-ene)

1,4-bis(bicyclo[2.2.1]hept-5-en-2-ylmethoxy)butane

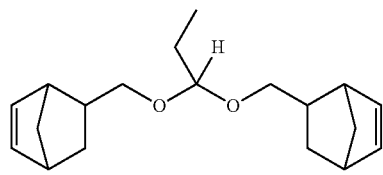 [SMILES: CCC(OCC1CC2C=CC1C2)OCC1CC2C=CC1C2]
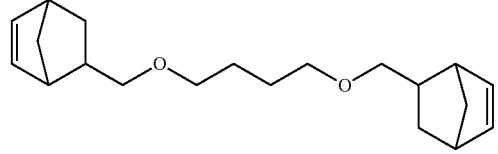 [SMILES: C1=CC2CC1CC2COCCCCOCC1CC2C=CC1C2]

5,5'-((propane-1,1-diylbis(oxy))bis(methylene))bis(bicyclo[2.2.1]hept-2-ene)

1,6-bis(bicyclo[2.2.1]hept-5-en-2-ylmethoxy)hexane

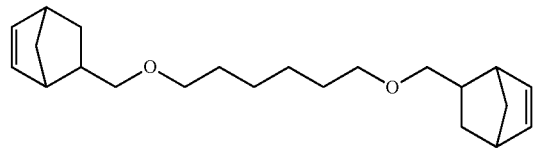 [SMILES: C1=CC2CC1CC2COCCCCCCOCC1CC2C=CC1C2]

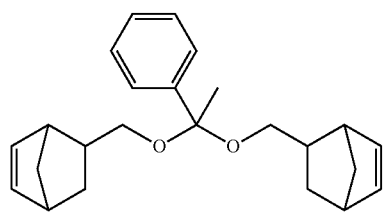

1,8-bis(bicyclo[2.2.1]hept-5-en-2-ylmethoxy)octane

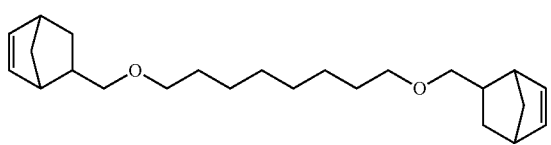 [SMILES: C1=CC2CC1CC2COCCCCCCCCOCC1CC2C=CC1C2]

5,5'-(((1-phenylethane-1,1-diyl)bis(oxy))bis(methylene))bis(bicyclo[2.2.1]hept-2-ene)

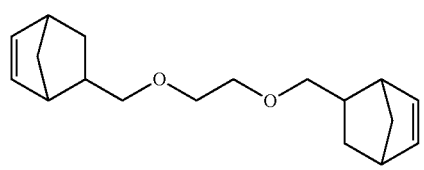

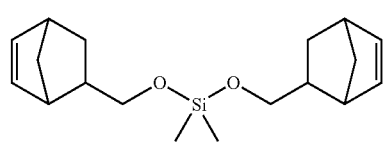 [SMILES: C[Si](C)(OCC1CC2C=CC1C2)OCC1CC2C=CC1C2]

bis(bicyclo[2.2.1]hept-5-en-2-ylmethoxy)dimethylsilane 1,2-bis(bicyclo[2.2.1]hept-5-en-2-ylmethoxy)ethane

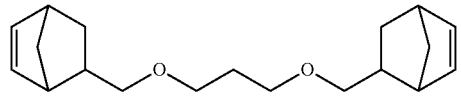

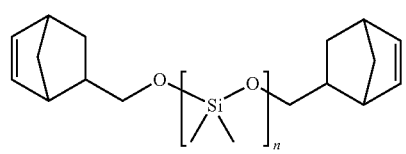

where n is 2 to 4;

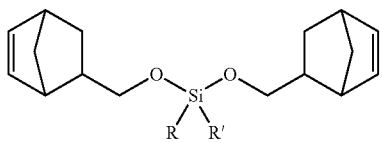

Where R and R' are independently selected from (C$_1$-C$_{12}$alkyl), (C$_6$-C$_{10}$aryl) and (C$_6$-C$_{10}$aryl)(C$_1$-C$_{12}$alkyl);

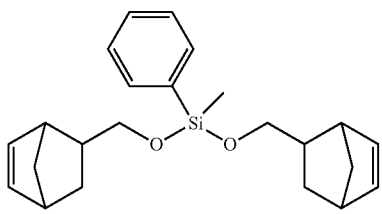 [SMILES: C[Si](OCC1CC2C=CC1C2)(OCC1CC2C=CC1C2)c1ccccc1]

bis(bicyclo[2.2.1]hept-5-en-2-ylmethoxy)(methyl)(phenyl)silane

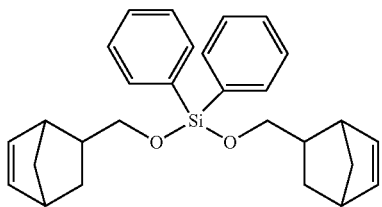 [SMILES: C1=CC2CC1CC2CO[Si](OCC1CC2C=CC1C2)(c1ccccc1)c1ccccc1]

bis(bicyclo[2.2.1]hept-5-en-2-ylmethoxy)diphenylsilane

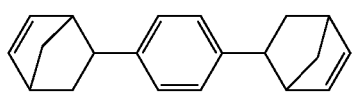 [SMILES: C1=CC2CC1CC2c1ccc(C2CC3C=CC2C3)cc1]

1,4-di(bicyclo[2.2.1]hept-5-en-2-yl)benzene

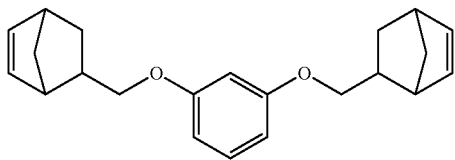 [SMILES: C1=CC2CC1CC2COc1cccc(OCC2CC3C=CC2C3)c1]

1,3-bis(bicyclo[2.2.1]hept-5-en-2-ylmethoxy)benzene

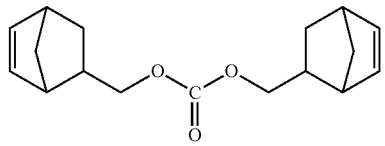 [SMILES: O=C(OCC1CC2C=CC1C2)OCC1CC2C=CC1C2]

bis(bicyclo[2.2.1]hept-5-en-2-ylmethyl) carbonate

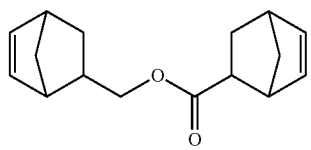 [SMILES: O=C(OCC1CC2C=CC1C2)C1CC2C=CC1C2]

bicyclo[2.2.1]hept-5-en-2-ylmethyl bicyclo[2.2.1]hept-5-ene-2-carboxylate

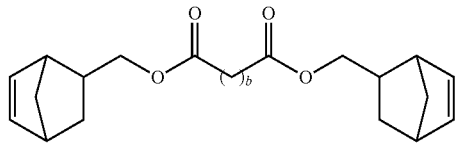

Where b is an integer form 1 to 6;

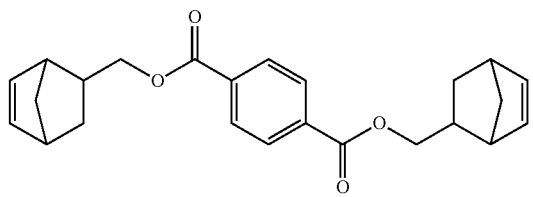 [SMILES: O=C(OCC1CC2C=CC1C2)c1ccc(C(=O)OCC2CC3C=CC2C3)cc1]

bis(bicyclo[2.2.1]hept-5-en-2-ylmethyl) terephthalate

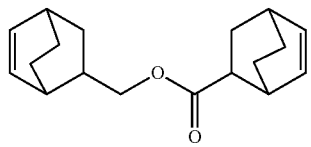 [SMILES: O=C(OCC1CC2C=CC1CC2)C1CC2C=CC1CC2]

bicyclo[2.2.2]oct-5-en-2-ylmethyl bicyclo[2.2.2]oct-5-ene-2-carboxylate

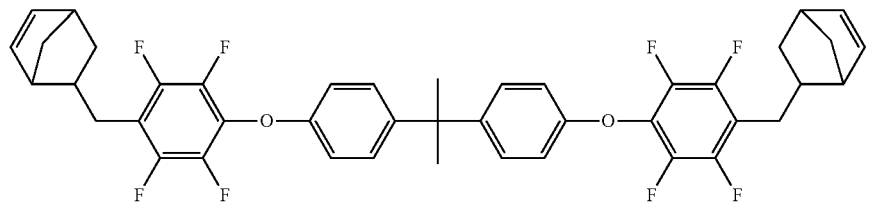 [SMILES: CC(C)(c1ccc(Oc2c(F)c(F)c(CC3CC4C=CC3C4)c(F)c2F)cc1)c1ccc(Oc2c(F)c(F)c(CC3CC4C=CC3C4)c(F)c2F)cc1]

5,5'-((((propane-2,2-diylbis(4,1-phenylene))bis(oxy))bis(2,3,5,6-tetrafluoro-4,1-phenylene))bis(methylene))bis(bicyclo[2.2.1]hept-2-ene)

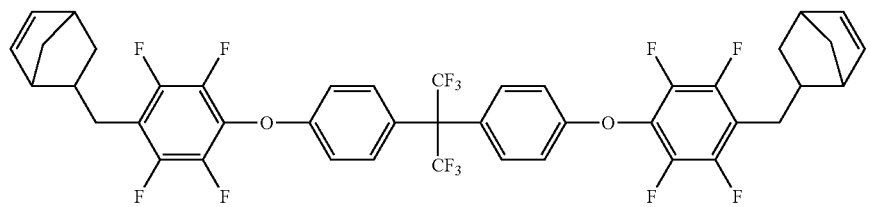 [SMILES: Fc1c(F)c(Oc2ccc(C(c3ccc(Oc4c(F)c(F)c(CC5CC6C=CC5C6)c(F)c4F)cc3)(C(F)(F)F)C(F)(F)F)cc2)c(F)c(F)c1CC1CC2C=CC1C2]

5,5'-(((((perfluoropropane-2,2-diyl)bis(4,1-phenylene))bis(oxy))bis(2,3,5,6-tetrafluoro-4,1-phenylene))bis(methylene))bis(bicyclo[2.2.1]hept-2-ene)

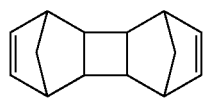 [SMILES: C1=CC2CC1C1C2C2C3C=CC(C3)C12]

1,4,4a,4b,5,8,8a,8b-octahydro-1,4:5,8-dimethanobiphenylene

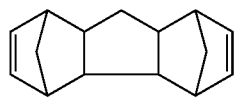

4,4a,4b,5,8,8a,9,9a-octahydro-1H-1,4:5,8-dimethanofluorene

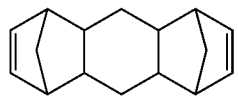 [SMILES: C1=CC2CC1C1CC3C4C=CC(C4)C3CC21]

1,4,4a,5,8,8a,9,9a,10,10a-decahydro-1,4:5,8-dimethanoanthracene

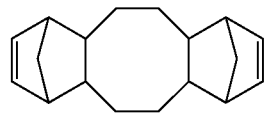 [SMILES: C1=CC2CC1C1CCC3C4C=CC(C4)C3CCC21]

1,4,4a,5,6,6a,7,10,10a,11,12,12a-dodecahydro-1,4:7,10-dimethanodibenzo[a,e][8]annulene; and

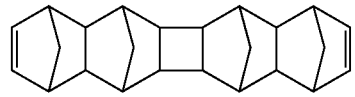 [SMILES: C1=CC2CC1C1C3CC(C21)C1C3C2C3CC(C4C5C=CC(C5)C34)C12]

1,4,4a,5,5a,5b,6,6a,7,10,10a,11,11a,11b,12,12a-hexadecahydro-1,4:5,12:6,11:7,10-tetramethanodibenzo[b,h]biphenylene Non-limiting examples of the compound of formula (III) maybe selected from the group consisting of:

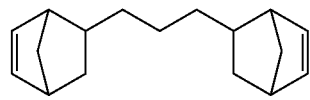 [SMILES: C1=CC2CC1CC2CCCC1CC2C=CC1C2]

21

1,3-di(bicyclo[2.2.1]hept-5-en-2-yl)propane

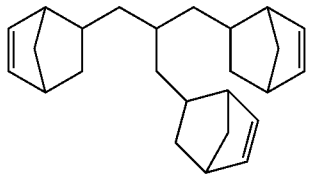 [SMILES: C1=CC2CC1CC2CC(CC1CC2C=CC1C2)CC1CC2C=CC1C2]

5,5'-(2-(bicyclo[2.2.1]hept-5-en-2-ylmethyl)propane-1,3-diyl)bis(bicyclo[2.2.1]hept-2-ene)

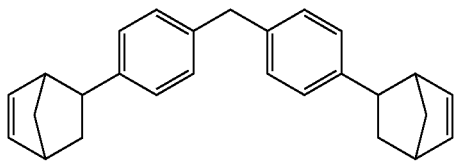 [SMILES: C1=CC2CC1CC2c1ccc(Cc2ccc(C3CC4C=CC3C4)cc2)cc1]

bis(4-(bicyclo[2.2.1]hept-5-en-2-yl)phenyl)methane

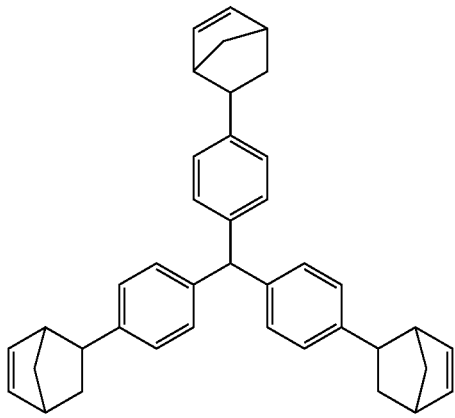 [SMILES: C1=CC2CC1CC2c1ccc(C(c2ccc(C3CC4C=CC3C4)cc2)c2ccc(C3CC4C=CC3C4)cc2)cc1]

tris(4-(bicyclo[2.2.1]hept-5-en-2-yl)phenyl)methane

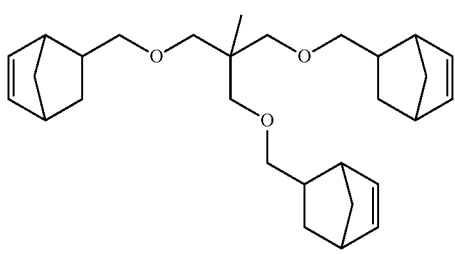 [SMILES: CC(COCC1CC2C=CC1C2)(COCC1CC2C=CC1C2)COCC1CC2C=CC1C2]

22

5,5'-(((2-((bicyclo[2.2.1]hept-5-en-2-ylmethoxy)methyl)-2-methylpropane-1,3-diyl)bis(oxy))bis(methylene))bis(bicyclo[2.2.1]hept-2-ene)

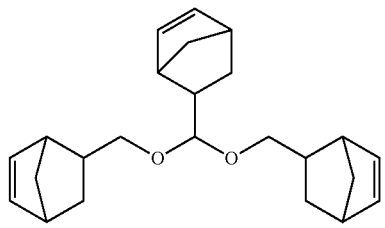 [SMILES: C1=CC2CC1CC2COC(OCC1CC2C=CC1C2)C1CC2C=CC1C2]

5,5'-(((bicyclo[2.2.1]hept-5-en-2-ylmethylene)bis(oxy))bis(methylene))bis(bicyclo[2.2.1]hept-2-ene)

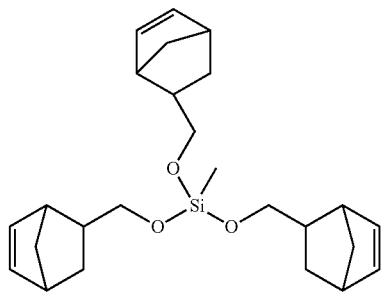 [SMILES: C[Si](OCC1CC2C=CC1C2)(OCC1CC2C=CC1C2)OCC1CC2C=CC1C2]

tris(bicyclo[2.2.1]hept-5-en-2-ylmethoxy)(methyl)silane; and

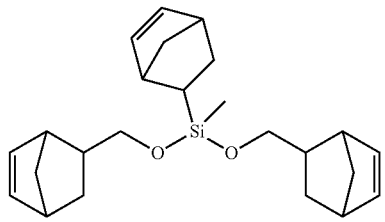 [SMILES: C[Si](OCC1CC2C=CC1C2)(OCC1CC2C=CC1C2)C1CC2C=CC1C2]

bicyclo[2.2.1]hept-5-en-2-ylbis(bicyclo[2.2.1]hept-5-en-2-ylmethoxy)(methyl)silane Non-limiting examples of the compound of formula (IV) maybe selected from the group consisting of:

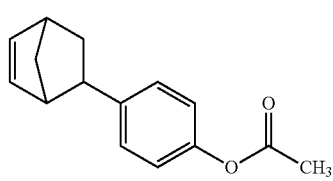 [SMILES: CC(=O)Oc1ccc(C2CC3C=CC2C3)cc1]

4-(bicyclo[2.2.1]hept-5-en-2-yl)phenyl acetate

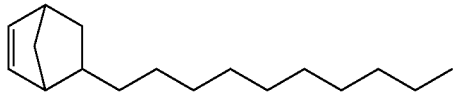 [SMILES: CCCCCCCCCCC1CC2C=CC1C2]

5-decylbicyclo[2.2.1]hept-2-ene

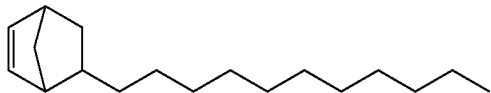 [SMILES: CCCCCCCCCCCC1CC2C=CC1C2]

5-undecylbicyclo[2.2.1]hept-2-ene; and

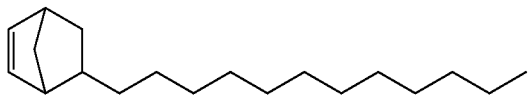 [SMILES: CCCCCCCCCCCCC1CC2C=CC1C2]

5-dodecylbicyclo[2.2.1]hept-2-ene

Various other reactive olefinic compounds that are suitable to be used in the compositions of this invention include the following:

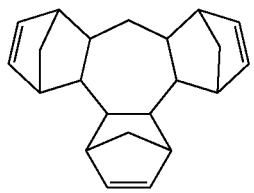 [SMILES: C1=CC2CC1C1CC3C4C=CC(C4)C3C3C4C=CC(C4)C3C21]

4,4a,4b,5,8,8a,9,9a,10,13,13a,13b-dodecahydro-1H-1,4:5,8:10,13-trimethanotribenzo[a,c,e][7]annulene; and

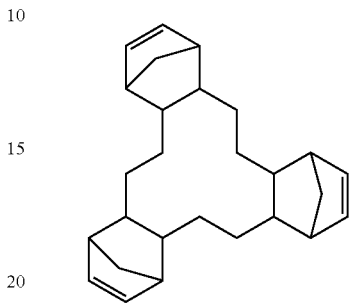

1,4,4a,5,6,6a,7,10,10a,11,12,12a,13,16,16a,17,18,18a-octadecahydro-1,4:7,10:13,16-trimethano-tribenzo[a,e,i][12]annulene As noted above, the compositions of this invention further encompass a photoacid generator (PAG). Exemplary PAGs without any limitation include, (p-isopropylphenyl)(p-methylphenyl)-iodonium tetrakis(pentafluorophenyl) borate (DPI-TPFPB), available commercially under the trade name RHODORSIL™ Photoinitiator 2074 from Rhodia, Inc.; (2-(4-methoxynaphthalen-1-yl)-2-oxoethyl)dimethylsulfonium tetrakis(perfluorophenyl)borate (MNDS-TPFPB), available commercially under the trade name TAG 382 from Toyo Inc.; tris(4-tert-butyl)phenyl)sulfonium tetrakis-(pentafluorophenyl)borate (TTBPS-TPFPB); tris(4-tert-butyl)phenyl)sulfonium hexafluorophosphate (TTBPS-HFP); triphenylsulfonium triflate (TPS-Tf); triazine (TAZ-101); triphenylsulfonium hexafluoroantimonate (TPS-103); triphenylsulfonium bis(perfluoromethanesulfonyl) imide (TPS-N1); di-(p-t-butyl) phenyliodonium bis(perfluoromethanesulfonyl) imide (DTBPI-N1); potassium tris(trifluoromethanesulfonyl) methanide, commercially available from Synquest Laboratories; di-(p-t-butylphenyl) iodonium tris(trifluoromethanesulfonyl)methanide (DTBPI-C1); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTBPI-Tf), diphenyliodonium trifluoromethanesulfonate, diphenyliodonium 1,1,2,2,3,3,4,4,4-nonafluorobutane-1-sulfonate; bis(4-(tert-butyl)phenyl)iodonium trifluoromethanesulfonate; and bis(4-(tert-butyl)phenyl)iodonium 1,1,2,2,3,3,4,4,4-nonafluorobutane-1-sulfonate; and combinations thereof.

In some embodiments the PAG used in the composition of this invention is selected from the group consisting of:
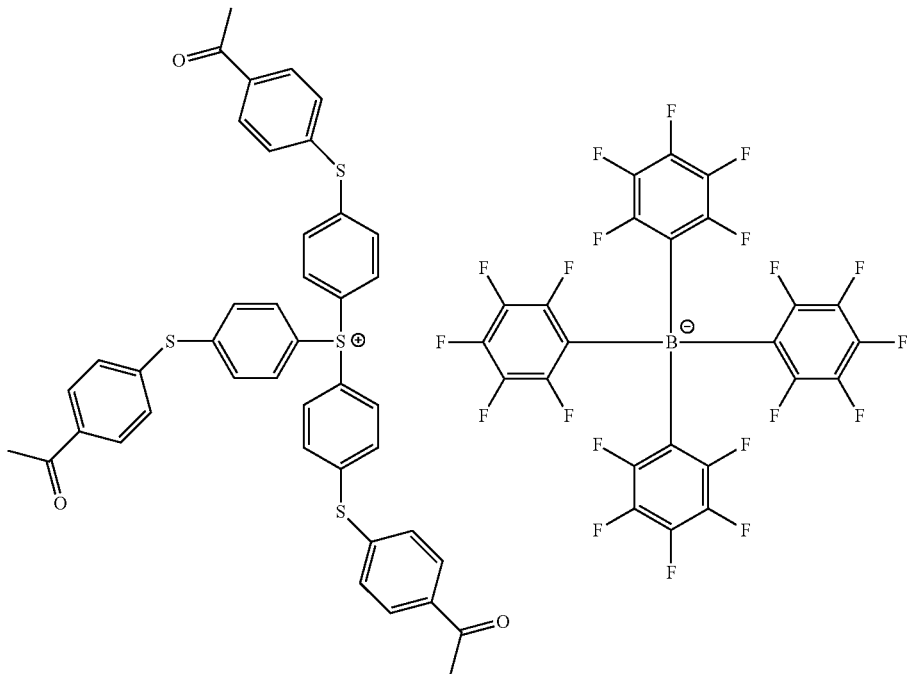 [SMILES: CC(=O)c1ccc(Sc2ccc([S+](c3ccc(Sc4ccc(C(C)=O)cc4)cc3)c3ccc(Sc4ccc(C(C)=O)cc4)cc3)cc2)cc1 ; Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F]
tris(4-((4-acetylphenyl)thio)phenyl)sulfonium tetrakis(perfluorophenyl)borate (Irgacure PAG 290, commercially available from BASF)
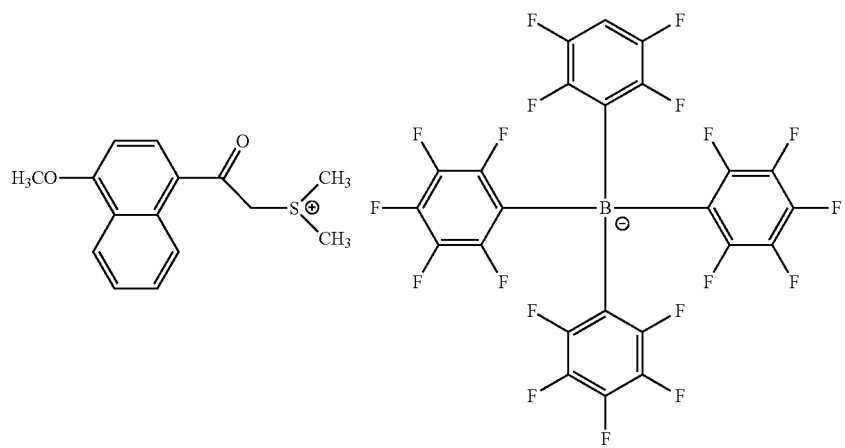 [SMILES: COc1ccc(C(=O)C[S+](C)C)c2ccccc12 ; Fc1cc(F)c(F)c([B-](c2c(F)c(F)c(F)c(F)c2F)(c2c(F)c(F)c(F)c(F)c2F)c2c(F)c(F)c(F)c(F)c2F)c1F]

27
(2-(4-methoxynaphthalen-1-yl)-2-oxoethyl)dimethylsulfonium tetrakis(perfluorophenyl)borate 28
(4-methylphenyl)(4-isopropylphenyl)iodonium tetrakis(perfluorophenyl)borate (Rhodorsil P12074)

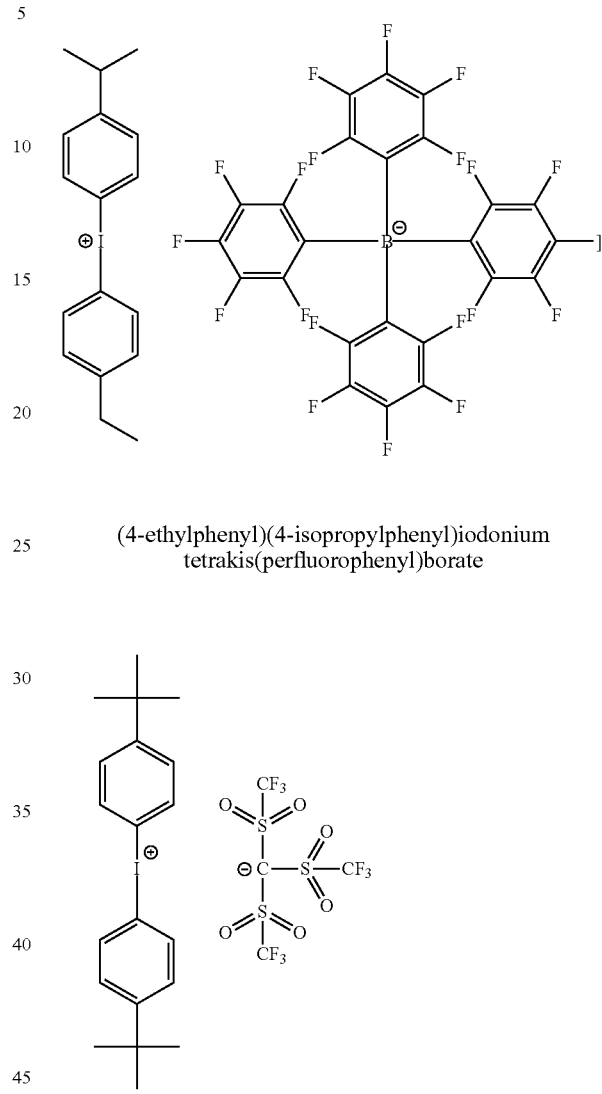

(4-ethylphenyl)(4-isopropylphenyl)iodonium tetrakis(perfluorophenyl)borate

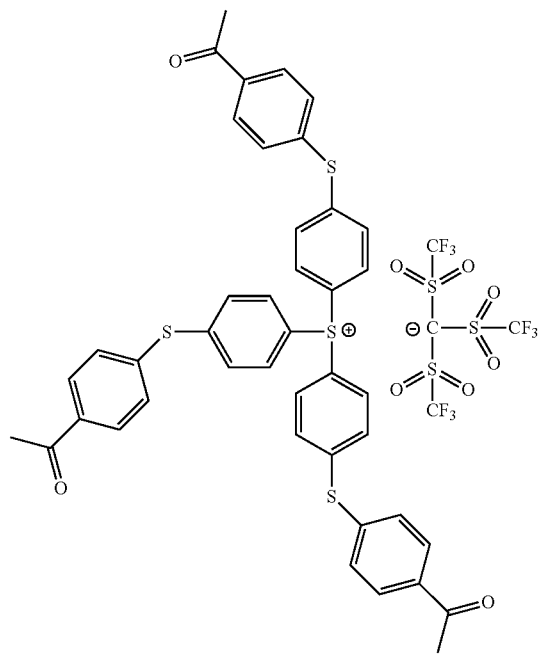 [SMILES: CC(=O)c1ccc(Sc2ccc([S+](c3ccc(Sc4ccc(C(C)=O)cc4)cc3)c3ccc(Sc4ccc(C(C)=O)cc4)cc3)cc2)cc1 ; O=S(=O)([C-](S(=O)(=O)C(F)(F)F)S(=O)(=O)C(F)(F)F)C(F)(F)F]

tris(4-((4-acetylphenyl)thio)phenyl)sulfonium tris((trifluoromethyl)sulfonyl)methanide di-(p-t-butylphenyl)iodonium tris(trifluoromethanesulfonyl)methanide

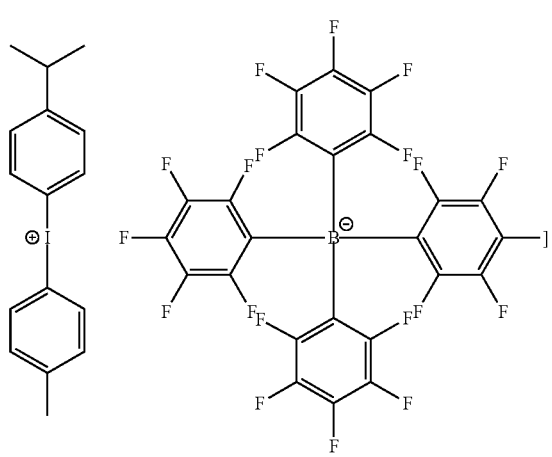

Again, as noted above, one or more of the above listed PAGs can be used as a mixture in any combination thereof.

Any of the polymer as described above can be used in the composition of this invention. Exemplary polymers without any limitation maybe selected from the group consisting of:

polyhydroxystyrene;

a terpolymer derived from norbornenyl-2-trifluoromethyl-3,3,3-trifluoropropan-2-ol (HFANB), 3-(bicyclo[2.2.1]hept-2-en-2-yl)propanoic acid (NBEtCOOH), and tri-oxanonanenorbornene (NBTON);

a copolymer derived from maleic anhydride and norbornene which is ring opened with butanol;

a copolymer derived from maleic anhydride and norbornene which is ring opened with n-octanol; and a copolymer derived from norbornenyl-2-trifluoromethyl-3,3,3-trifluoropropan-2-ol (HFANB) and bicyclo[2.2.1]hept-5-en-2-ylmethanol (NBMeOH).

In some embodiments the composition of this invention encompasses one or more of compounds of formulae (II), (III) or (IV) which are selected from the group consisting of:
5,5'-(oxybis(methylene))bis(bicyclo[2.2.1]hept-2-ene);
5,5'-(oxybis(ethane-2,1-diyl))bis(bicyclo[2.2.1]hept-2-ene);
bis(bicyclo[2.2.1]hept-5-en-2-ylmethoxy)methane;
4-(bicyclo[2.2.1]hept-5-en-2-yl)phenyl acetate; and
5-decylbicyclo[2.2.1]hept-2-ene.

In some embodiments the composition of this invention encompass a photoacid generator which is selected from the group consisting of:
tris(4-((4-acetylphenyl)thio)phenyl)sulfonium tetrakis(perfluorophenyl)borate;
(2-(4-methoxynaphthalen-1-yl)-2-oxoethyl)dimethylsulfonium tetrakis(perfluorophenyl)borate;
tris(4-((4-acetylphenyl)thio)phenyl)sulfonium tris((trifluoromethyl)sulfonyl)methanide;
(4-ethylphenyl)(4-isopropylphenyl)iodonium tetrakis(perfluorophenyl)borate; and
di-(p-t-butylphenyl)iodonium tris(trifluoromethanesulfonyl)methanide.

In a further aspect of this invention there is provided a negative tone photoimagable composition comprising:
a) a polymer having a pendent acidic group, which is selected from the group consisting of:
i) a polymer of formula (Ia):

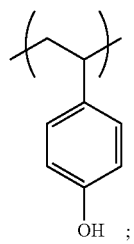

(Ia)

ii) a polymer comprising a repeating unit of formula (Ib) derived from a monomer of formula (IB):

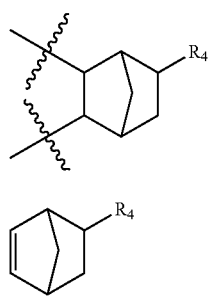

(Ib)

(IB)

wherein ⌇ represents a position at which the bonding takes place with another repeat unit;
$R_4$ is selected from —$(CH_2)_v$—$CO_2R_{4a}$, —$(CH_2)_v$—Ar—OH, —$(CH_2)_v$—C(O)—Ar—OH,
—$(CH_2)_v$—OC(O)—Ar—OH, —$(CH_2)_v$—C(O)O—Ar—OH, and —C(O)O$(CH_2)_v$—Ar—OH,
where each v is independently an integer from 0 to 4, and $R_{4a}$ is hydrogen or $(C_1-C_4)$alkyl, Ar is substituted or unsubstituted phenyl or naphthyl where substituents if present are selected from halogen, $(C_1-C_4)$alkyl, fluorinated or perfluorinated $(C_1-C_4)$alkyl, $(C_1-C_4)$alkoxy and fluorinated or perfluorinated $(C_1-C_4)$alkoxy; and iii) a polymer comprising one or more distinctive monomer repeating units of formula (Ic) derived from a monomer of formula (IC) and maleic anhydride-type repeating units of formulae (Id1) and (Id2) derived from a maleic anhydride monomer of formula (ID):

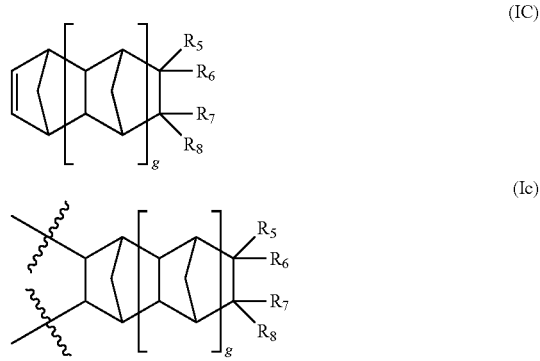

wherein:
⌇ represents a position at which the bonding takes place with another repeat unit;
g is 0;
$R_5$, $R_6$, $R_7$ and $R_8$ are the same or different and independently of each other selected from the group consisting of hydrogen, methyl, ethyl, a fluorinated or perfluorinated methyl, ethyl and a linear or branched substituted or unsubstituted $(C_3-C_{25})$hydrocarbyl group;

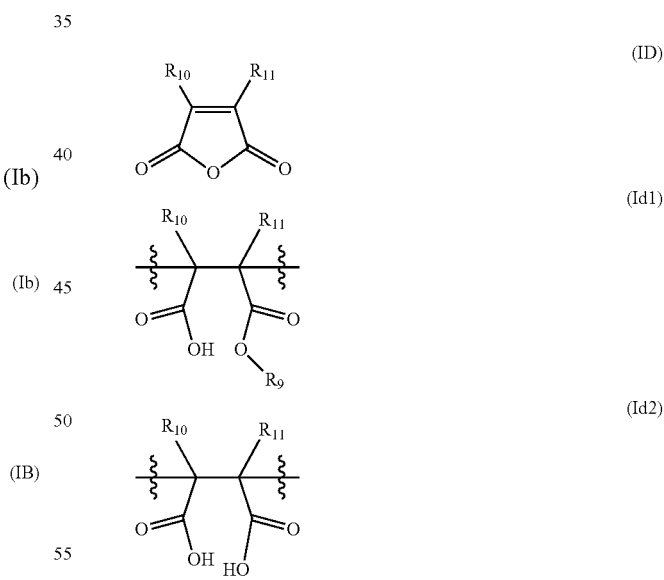

wherein:
⌇ represents a position at which the bonding takes place with another repeat unit;
$R_9$ is selected from the group consisting of hydrogen, methyl, ethyl, a fluorinated or perfluorinated methyl or ethyl, a linear or branched $(C_3-C_9)$hydrocarbyl and a linear or branched fluorinated or perfluorinated $(C_3-C_9)$hydrocarbyl group;
$R_{10}$ and $R_{11}$ are the same or different and are selected from hydrogen, methyl and ethyl;

b) a compound selected from the group consisting of:
5,5'-(oxybis(methylene))bis(bicyclo[2.2.1]hept-2-ene);
5,5'-(oxybis(ethane-2,1-diyl))bis(bicyclo[2.2.1]hept-2-ene);
bis(bicyclo[2.2.1]hept-5-en-2-ylmethoxy)methane;
4-(bicyclo[2.2.1]hept-5-en-2-yl)phenyl acetate; and
5-decylbicyclo[2.2.1]hept-2-ene; and c) a photoacid generator selected from the group consisting of:
tris(4-((4-acetylphenyl)thio)phenyl)sulfonium tetrakis(perfluorophenyl)borate;
(2-(4-methoxynaphthalen-1-yl)-2-oxoethyl)dimethylsulfonium tetrakis(perfluorophenyl)borate;
tris(4-((4-acetylphenyl)thio)phenyl)sulfonium tris((trifluoromethyl)sulfonyl)methanide;
(4-ethylphenyl)(4-isopropylphenyl)iodonium tetrakis(perfluorophenyl)borate; and
di-(p-t-butylphenyl)iodonium tris(trifluoromethanesulfonyl)methanide.

The composition of this invention is generally available as a solution. Thus, the polymer of formula (I), the compounds of formulae (II), (III) and (IV) and one or more PAGs are generally dissolved in one or more solvents. Any of the solvents that would dissolve all of these components to form a homogeneous solution can be employed. Exemplary solvents that can be used in the composition of this invention without any limitation maybe selected from the group consisting of: N-methyl-2-pyrrolidone (NMP), γ-butyrolactone (GBL), N,N-dimethylacetamide (DMAc), dimethylsulfoxide (DMSO), diethyleneglycol dimethylether, diethyleneglycol diethylether, diethyleneglycol dibutylether, propyleneglycol monomethylether (PGME), dipropylene glycol monomethylether, propyleneglycol monomethylether acetate (PGMEA), methyl lactate, ethyl lactate, butyl lactate, methyl ethyl ketone (MEK), methyl amyl ketone (MAK), cyclohexanone, tetrahydrofuran, methyl-1,3-butyleneglycolacetate, 1,3-butyleneglycol-3-monomethylether, methyl pyruvate, ethyl pyruvate, methyl-3-methoxypropionate and a mixture in any combination thereof.

Any amount of compound of formulae (II), (III) or (IV) can be employed in the composition of this invention which brings about the desired results as described herein. Generally, such amount can range from 1 to 50 parts per hundred parts by mass (pphr) of the polymer (resin) as described herein. In some other embodiments such amount can range from 5 to 30 pphr and in some other embodiments such amount can range from 10 to 20 pphr.

Similarly, any amount of PAG can be employed in the composition of this invention which brings about the desired results as described herein. Generally, such amount can range from 0.1 to 5 parts per hundred parts by mass (pphr) of the polymer (resin) as described herein. In some other embodiments such amount can range from 0.5 to 3 pphr and in some other embodiments such amount can range from 1 to 2 pphr.

The composition of this invention further encompasses one or more compounds having utility as, among other things, adhesion promoters, antioxidants, crosslinking, coupling (such as for example a silane coupling agent) or a curing agent or a curing accelerator, and the like. Other such suitable additives also include a phenolic resin, a leveling agent, a flame retardant, and a plasticizer. It should again be noted that any one of these compounds can be used alone or as mixtures in any combination thereof. Again, any amount of one or more of aforementioned compounds can be used in the composition of this invention so as to bring about the desired results. Generally it has now been found that such amounts can range from 0.1 to 20 parts per hundred parts of the polymer resin (pphr). In some embodiments such amounts range from 1 to 10 pphr.

The composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example spin coating, spraying, doctor blading, meniscus coating, ink jet coating and slot coating.

Next, the coated substrate is heated to facilitate the removal of residual casting solvent, for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photoactive compound and/or photosensitizer incorporated into the composition as described herein. However, generally such appropriate wavelength is from 193 to 700 nm. It will be understood that the phrase "imagewise exposure" means exposing through a masking element to provide for a resulting pattern of exposed and unexposed portion of the film.

After an imagewise exposure of the film formed from composition embodiments in accordance with the present invention, a development process is employed. For the negative tone composition of the present invention, such development process removes only unexposed portions of the film thus leaving a negative image of the masking layer in the film. For some embodiments, a post exposure bake can be employed prior to the aforementioned development process.

The development process generally utilizes an aqueous or an organic solvent developer. Suitable aqueous developers include solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as propylene glycol monomethyl ether acetate (PGMEA), di(propylene glycol) methyl ether acetate (DIPGMEA), 2-heptanone, cyclohexanone, toluene, xylene, ethyl benzene, mesitylene and butyl acetate, and a mixture in any combination thereof, among other suitable solvents.

Thus some formulation embodiments of the present invention provide self-imagable films that after imagewise exposure, the resulting image is developed using an aqueous base solution, while for other such embodiments the resulting image is developed using an organic solvent. Regardless of which type of developer is employed, after the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has not been exposed during the imagewise exposure, image fixing is generally accomplished by causing a reaction within the remaining portions of the film. Such reaction is generally a crosslinking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. The heating is generally carried out at a desirable temperature, for example, from above 110° C. for a time of from 40 min to one or more hours. Accordingly, in some embodiments such heating can be at 165° C. for 3 to 6 hours, 170° C. for 4 to 6 hours or 175° C. for 4 to 6 hours, and so on. Where the remaining layer has been exposed during the image-wise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

The devices are produced by using embodiments of the composition of the present invention to form layers which are characterized as having high heat resistance, an appropriate water absorption rate, high transparency, and low permittivity. In addition, such layers generally have an advantageous coefficient of elasticity after curing, 0.1 kg/mm$^2$ to 200 kg/mm$^2$ being typical.

As previously mentioned, exemplary applications for embodiments of the photosensitive compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, and printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a composition which exhibits enhanced characteristics with respect to one or more of mechanical properties (such as low-stress retained elongation to break after aging) and at least equivalent chemical resistance, as compared to alternate materials. In addition such embodiments provide generally excellent electrical insulation, adhesion to the substrate, and the like. Thus semiconductor devices, device packages, and display devices are provided that incorporate embodiments in accordance with the present invention.

In particular, the compositions of this invention can be used to form adhesive layers for bonding the semiconductor chips to each other, such as in chip-stack applications. For example, a bonding layer used for such a purpose is composed of a cured product of the adhesive composition of the present invention. Although the adhesive layer is generally a single-layer structure, it should provide sufficient adhesiveness to the substrate and should be free of significant stress resulting due to the curing step. Accordingly, it is now possible to avoid undesirably thick layer of film encompassing the chip as a laminate. It is further anticipated that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example.

Generally, the developed patterned layer is hardbaked at a desirable temperature to remove any of the components contained therein which may decompose and/or outgas during the downstream processing conditions. For example, the photoacid generators (PAGs) used herein decompose and may outgas at certain high temperature conditions. Therefore, any PAGs left in the exposed patterned layer need to be removed by post development hard baking at a suitable temperature in order to avoid any downstream outgassing. The hardbake can be carried out by heating the developed patterned layer at any temperature higher than 110° C. and typically in the temperature range of 120° C. to 170° C. for a period of about 20 minutes to several hours.

Next, the hardbaked surface is reactive ion etched (RIE) to remove any minor contamination or scum in the developed areas of the substrate (i.e., a wafer). Any of the RIE methods can be used for this purpose. Then the etched layer is ashed to prepare the surface for thermo-compression bonding with another substrate to form a plurality of chip-stacks.

It has now been found that by employing the compositions of this invention very high resolution images can be formed. The resolution of the images can be in the range from 1 to 100 μm. In some other embodiments, the resolution of the images can be in the range from 3 to 30 μm. In yet some other embodiments, the resolution of the images can be in the range from about 5 to 15 μm.

Further, in some embodiments of this invention as described above, the electronic and/or the semiconductor device according to this invention encompass a laminated semiconductor element where said lamination consists of a composition according to the present invention.

In some embodiments of this invention, the semiconductor device encompassing a redistribution layer (RDL) structure further incorporates a composition according to this invention.

Further, in some embodiments of this invention as described above, the semiconductor device encompassing a chip stack structure further includes a composition according to this invention.

In yet some other embodiments of this invention as described above, the semiconductor device encompassing a complementary metal oxide semiconductor (CMOS) image sensor dam structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photopattern; and curing the film by heating to a suitable temperature.

The coating of the substrate with photosensitive composition of this invention can be performed by any of the coating procedures as described herein and/or known to one skilled in the art, such as by spin coating.

In addition, the developing in accordance with the method of this invention can be performed by any of the known developing techniques such as by the use of an aqueous base solution such as TMAH or an organic solvent as described herein.

In some embodiments of this invention, the method according to this invention utilizes a developer, which is PGMEA and aqueous base developers such as TMAH (commercially available under the tradename CD-26 from Microchem).

In addition, in some of the embodiments of this invention, a substrate is first hard baked in the method according to this invention before the curing step at a temperature of from 130° C. to 160° C. for 20 minutes to 60 minutes.

Finally, in some other embodiments of this invention, the curing is performed at a temperature of from 170° C. to 200° C. at an incremental heating ramp of 5° C. and for 1 to 5 hours.

In another embodiment there is further provided a method of manufacturing a semiconductor device having a plurality of chip stacks comprising:

coating a surface of a first substrate with a photosensitive composition according to the invention to form a film;

heating the coated substrate to a temperature from 70° C. to 130° C. for 1 to 30 minutes;

imagewise exposing the coated substrate to an actinic radiation to form a patterned layer on the substrate;

developing the patterned layer;

heating the patterned layer;

subjecting the heated patterned layer to reactive ion etching (RIE) to remove any contaminants or scum in the developed areas of the substrate;

subjecting the etched layer to ashing to prepare the surface for thermo-compression bonding;

providing a second substrate;

contacting the second substrate to the surface of the first substrate containing the polymer layer where such contacting comprises thermal compression bonding whereby causing the bonding of the surface of the first substrate with the surface of the second substrate; and curing the first and second substrate by heating to a suitable temperature.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:

NBEtOEtNB—5,5'-(oxybis(ethane-2, 1-diyl))bis(norbornene); NBCH$_2$OCH$_2$OCH$_2$NB—bis(5-norbornen-2-yl-methoxy)methane; NB—norbornene; HFANB—2-(bicyclo[2.2.1]hept-5-en-2-ylmethyl)-1,1,1,3,3,3-hexafluoropropan-2-ol; NBTON—5-((2-(2-methoxyethoxy)ethoxy)-methyl)bicyclo[2.2.1]hept-2-ene; NBEtCOOH—3-(bicyclo[2.2.1]hept-5-en-2-yl)propanoic acid; NBMeOH—5-methanol-2-norbornene; TFSNB—N-(bicyclo[2.2.1]hept-5-en-2-ylmethyl)-1,1,1-trifluoromethanesulfonamide; DANFABA—N,N-dimethylaniliniumtetrakis(pentafluorophenyl)borate; NBPhOAc—5-phenylacetate-2-norbornene; DecNB—5-decyl-2-norbornene; PHS—poly(4-hydroxystyrene), purchased from Sigma; MA—maleic anhydride; ROMA—ring-opened maleic anhydride; Irgacure PAG 290—tris(4-((4-acetylphenyl)thio)phenyl)sulfonium tetrakis(perfluorophenyl)borate; PAG—photoacid generator; and GPC—gel permeation chromatography.

Polymer Examples

The polymers used to form the compositions of this invention are generally known in the literature and are prepared in accordance with the well-known literature procedures. Poly(para-hydroxystyrene) (PHS) was purchased from Sigma. A representative polymer example is provided below for illustrative purposes only.

Example 1

ROMA Copolymer of MA/NB Ring Opened with n-Butanol

The title polymer was prepared in accordance with the procedures set forth in U.S. Pat. No. 8,715,900. The polymer was obtained as a solution in PGMEA (20 wt. % solution) and was used as such in the composition Example 11 and Comparative Example 3. The polymer so formed was characterized by GPC: $M_w$=13,500, $M_w/M_n$=1.8.

Example 2

Terpolymer of HFANB/NBTON/NBEtCOOH

The title polymer was prepared in accordance with the procedures set forth in U.S. Pat. No. 9,341,949. The polymer was obtained as a solution in PGMEA (20 wt. % solution) and was used as such in the composition Example 10 and Comparative Example 2. The polymer so formed was characterized by GPC: $M_w$=62,000, $M_w/M_n$=2. The molar monomer ratio as determined by NMR was found to be HFANB/NBTON/NBEtCOOH=48/40/12.

Example 3

Copolymer of HFANB/NBMeOH

A reactor was charged with HFANB (1810 g, 6.6 moles), MeOAcNB (728 g, 4.4 moles), DANFABA (28.8 g, 0.04 moles), formic acid (27.5 g, 0.6 moles), and toluene (2000 g). A syringe pump was charged with additional MeOAcNB (200 g, 1.2 moles). In a dry box [(acetylacetonate)palladium (II) bis(acetonitrile)] [tetrakis(pentafluorophenyl)borate] (11.6 g) was charged to a pressure cylinder. Anhydrous ethyl acetate (132 g) was airlessly added to the pressure cylinder to dissolve the Pd catalyst. The solution in the reactor was heated to 70° C. under a nitrogen atmosphere. The catalyst solution was then transferred to the heated reaction mixture. Following catalyst injection the syringe pump containing MeOAcNB was started and monomer was added to the reactor according to a predetermined schedule: 0.733 g/min for 28 minutes, 0.262 g/min for 78 minutes, 0.190 g/min for 108 minutes, 0.159 g/min for 128 minutes, 0.134 g/min for 153 minutes, 0.106 g/min for 194 minutes, 0.078 g/min for 264 minutes and 0.068 g/min for 303 minutes. At the end of the predetermined schedule any residual MeOAcNB monomer in the syringe was discarded. The solution was mixed for 22 hours following catalyst injection. The polymer solution was cooled to room temperature. Residual catalyst was removed and the MeOAcNB was deprotected to form MeOHNB. The polymer solution was precipitated into heptanes and dried in a vacuum oven at 70° C. The precipitated and dried polymer (21.5 g) was then dissolved in PGMEA (100 g) and used in the composition Example 12. The molar monomer ratio as determined by NMR was found to be HFANB/NBMeOH=63/37. GPC: $M_w$=3640, $M_w/M_n$=1.4.

Example 4

NBEtOEtNB

Norbornene ethanol (NBEtOH), anhydrous tetrahydrofuran (THF), and sodium tert-pentoxide (NaO-tPen) of 95% assay were added to a 20-liter glass reactor as follows: NBEtOH (1360 g, 9.85 mol); THF (6590 g); NaO-tPen (540 g, 4.91 mol). The jacketed and agitated glass reactor was also equipped with a water cooled overhead condenser and a 10 liter glass overhead receiver vessel. Oxygen was removed from the reactor system using (3) pressure/vent swings with nitrogen. After this nitrogen purge process, the reactor was isolated under a nitrogen atmosphere and cooled to 0° C. Toluenesulfonyl chloride (TsCl) (940 g, 4.93 mol) was slowly added to the reaction mixture while maintaining temperature in range 0-10 OC. The reaction mixture was then heated to 50° C. and maintained at this temperature for 92 hours. The crude product was then distilled under vacuum to obtain NBEtOEtNB (≥99.5% assay by GC).

Example 5

$NBCH_2OCH_2OCH_2NB$

The title compound was prepared in accordance with the procedures set forth in U.S. Pat. No. 8,753,790.

Example 6

NBPhOAc

The title compound was prepared in accordance with the procedures set forth in U.S. Pat. No. 8,753,790.

Example 7

DecNB

The title compound was prepared in accordance with the literature procedures for preparing similar compounds starting from dicyclopentadiene (DCPD) and 1-dodecene, see for example, Sagane et al., Makromol. Chem. Phys. 1993, 31, 175.

Composition Examples 8-15

The compositions were made by addition of PGMEA to solid polymer (in the case of PHS). The amount of polymer and PGMEA used in each of these Examples 8-15 are summarized in Table 1. In Composition Examples 10 to 12, the respective polymers used therein were used as such in the solution form as obtained in the respective preparative Examples 2, 1 and 3. To each of the PGMEA solutions were added the compounds of formulae (II), (III) or (IV) and PAG as summarized in Table 1. Finally, the PAG, in all cases, Irgacure PAG 290 was added to the resulting solution. The compositions were then mixed until all materials dissolved.

TABLE 1

| Example No. | Polymer (g) | Compound of formulae (II), (III) or (IV) (g) | PAG (g)* | Solvent added (g) |
|---|---|---|---|---|
| 8 | PHS (0.5) | NBEtOEtNB (0.055) | (0.011) | PGMEA (4.5) |
| 9 | PHS (0.5) | $NBCH_2OCH_2OCH_2NB$ (0.055) | (0.011) | PGMEA (4.5) |
| 10 | Polymer example 2 (7 g of 20% PGMEA solution) | NBEtOEtNB (0.16) | (0.018) | — |
| 11 | Polymer example 1 (5.6 g of 20% PGMEA solution) | NBEtOEtNB (0.44) | (0.028) | — |
| 12 | Polymer from example 3 (5.6 g of 21.5% PGMEA solution) | NBEtOEtNB (0.88) | (0.028) | — |
| 13 | PHS (1.0) | Diallyl phthalate (1.0) | (0.022) | PGMEA (8.0) |
| 14 | PHS (1.0) | NBPhOAc (1.0) | (0.022) | PGMEA (8.0) |
| 15 | PHS (0.4) | DecNB (0.2) | (0.022) | PGMEA (4.0) |

*Irgacure PAG 290 (BASF)

Comparative Examples 1-3

In these Comparative Examples the compositions were made substantially in the same fashion as described in Examples 8-15 except that no compounds of formulae (II), (III) or (IV) were added to the polymer solution. The amount of polymer, PAG and PGMEA used in each of these Comparative Examples 1-3 are summarized in Table 2.

TABLE 2

| Example No. | Polymer (g) | Compound of formulae (II), (III) or (IV) (g) | PAG (g)* | Solvent added (g) |
|---|---|---|---|---|
| Comparative Example 1 | PHS (0.5) | — | (0.011) | PGMEA (4.5) |
| Comparative Example 2 | Polymer from Example 2 (7 g of 20% PGMEA solution) | — | (0.018) | — |
| Comparative Example 3 | Polymer from Example 1 (5.6 g of 20% PGMEA solution) | — | (0.028) | — |

Imaging Examples (TMAH and Solvent Developed)

The compositions of Examples 8-15 and the Comparative Examples 1-3 were filtered through a 0.45 micron PTFE syringe filter. Then the solutions were coated onto 4 inch silicon oxide wafers by spin coating. The wafers were then post-apply baked for 2 min at 100° C. unless otherwise indicated. The wafers were image-wise exposed using an ABM mask aligner through a variable density mask at an exposure dose of 113 mJ/cm$^2$ except in Example 15, an exposure dose of 250 mJ/cm$^2$ was used. The wafers were then post-exposure baked for 2 min at 100° C. unless otherwise indicated. The wafers were then developed with either TMAH (CD-26) or PGMEA as summarized in Table 3. In all cases the images observed were negative tone. That is to say, where light exposed the film, the film did not develop off the wafer. The minimum contact hole feature size (min. feature) was determined by microscopy and the film thickness loss during development was also determined (FT loss), the results are summarized in Table 3.

TABLE 3

| Imaging of Composition Example No. | Exposure dose | Development | Min. feature | FT loss (FT μm) |
|---|---|---|---|---|
| 8 | 113 mJ/cm$^2$ | CD-26, 10 sec | 5 micron | 0% (1.0) |
| 8 | 113 mJ/cm$^2$ | PGMEA, 10 sec | 10 micron | 0% (0.7) |
| 9 | 113 mJ/cm$^2$ | CD-26, 10 sec | 5 micron | 7% (0.94) |
| 10 | 113 mJ/cm$^2$ | CD-26, 10 + 10 sec | 20 micron | 4% (0.85) |
| 11* | 113 mJ/cm$^2$ | CD-26, 2 sec | 7 micron | 14% (0.94) |
| 12* | 113 mJ/cm$^2$ | CD-26, 10 min | 15 micron | 0% (0.64) |
| 13 | 113 mJ/cm$^2$ | CD-26, 10 sec | 25 micron | 28% (1.62) |
| 14 | 113 mJ/cm$^2$ | CD-26, 10 sec | 3 micron | 39% (2.11) |
| 15** | 250 mJ/cm$^2$ | CD-26, 10 + 10 sec | 20 micron | 0% (0.5) |
| Comparative Example 1 | 113 mJ/cm$^2$ | CD-26, 10 sec | — | 100% (0.8) |
| Comparative Example 2 | 113 mJ/cm$^2$ | CD-26, 10 + 10 sec | — | 100% (0.85) |
| Comparative Example 3* | 113 mJ/cm$^2$ | CD-26, 2 sec | — | 100% (0.98) |

*wafer treated with hexamethyldisilazane (10% in PGMEA) then baked at 100° C. for 1 min.
**Post apply bake was 1 min at 80° C., the film was hazy after coating, but imaged well.
FT = film thickness The results as summarized in Table 3 clearly show that the Comparative Examples 1 to 3 in which no compounds of formulae (II), (III) or (IV) are used did not provide any photo-patterned images after development as all of the films were dissolved in the developing medium.

On the other hand when compounds of formulae (II), (III) or (IV) are used with the polymer having an acidic pendent group as described herein forms readily negative tone images with the wafers when image-wise exposed. This feature is clearly shown in FIGS. 1 to 6.

Now turning to FIG. 1, which shows optical micrograph of the images formed from the composition of Example 8, which contained PHS as a polymer containing the repeat units of formula (I) and NBEtOEtNB, a representative compound of formula (II). It is quite evident from this micrograph that excellent negative tone images are observed with no film thickness loss after TMAH development. From FIG. 1 it is also evident that the minimum feature size of the images is at least about 5 micron.

Figure 2:
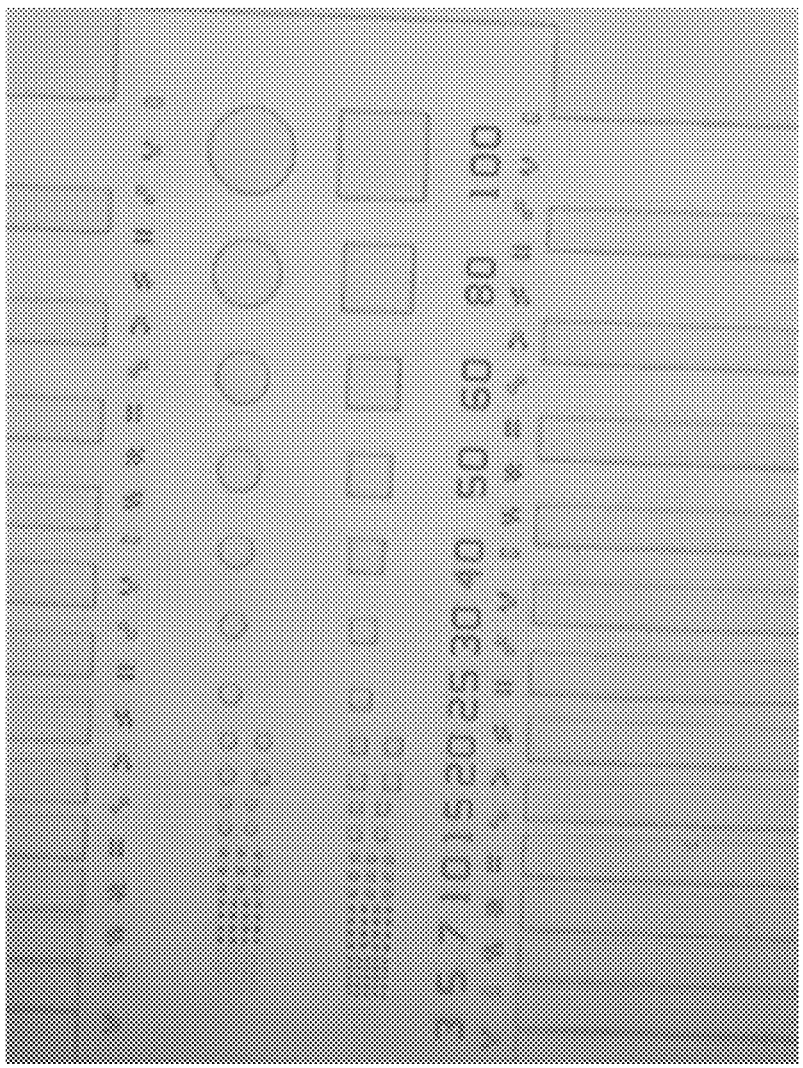
FIG. 2 shows an optical micrograph of a negative tone lithographic images of line and space pattern obtained from another composition embodiment of this invention.

FIG. 2 similarly shows excellent images can be formed from the composition of Example 9, where PHS was again employed as the polymer containing the repeat units of formula (I) and NBCH$_2$OCH$_2$OCH$_2$NB, another representative compound of formula (II). In this case, the developer used was also TMAH. The image resolution was again around 5 microns as summarized in Table 3.

Figure 3:
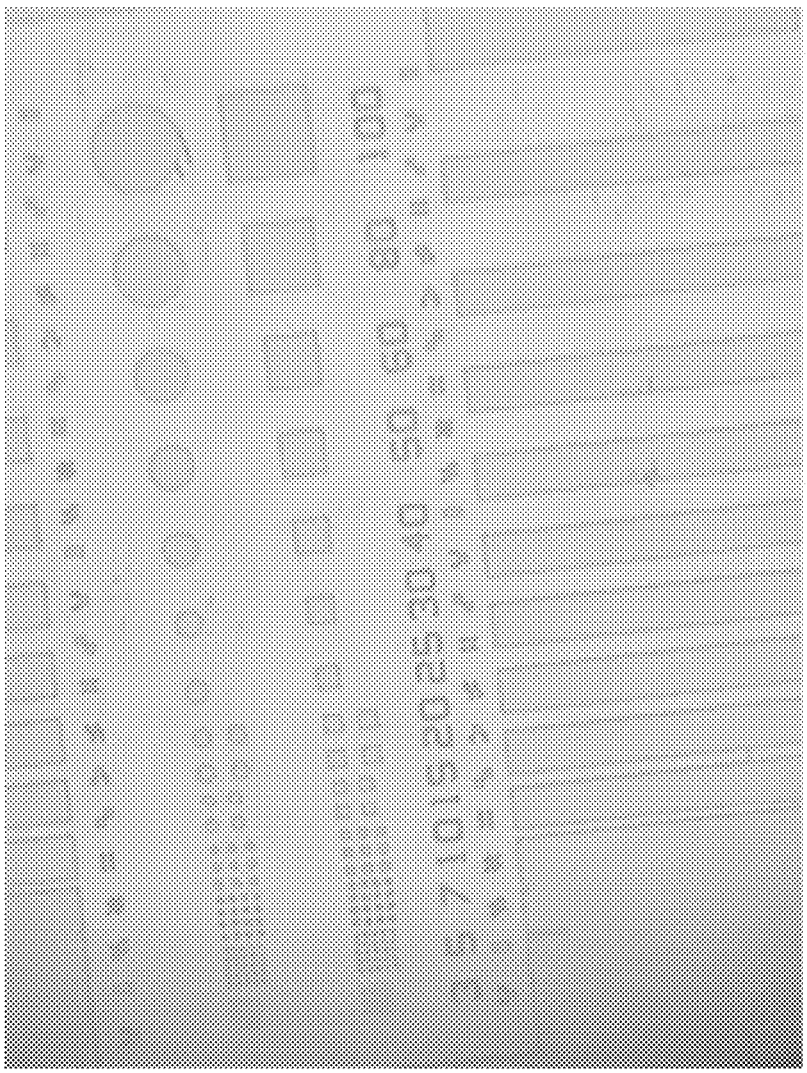
FIG. 3 shows an optical micrograph of a negative tone lithographic images of line and space pattern obtained from yet another composition embodiment of this invention.

Now turning to FIG. 3, which shows optical micrograph of the images formed from the composition of Example 10, which contained a polymer of Example 2 as polymer containing the repeat units of formula (I) and NBEtOEtNB, a representative compound of formula (II). It is again evident from this micrograph that good negative tone images are observed with a small film thickness loss of about 4% after TMAH development. From FIG. 3 it is also evident that the minimum feature size of the images is at least about 20 micron.

Figure 4:
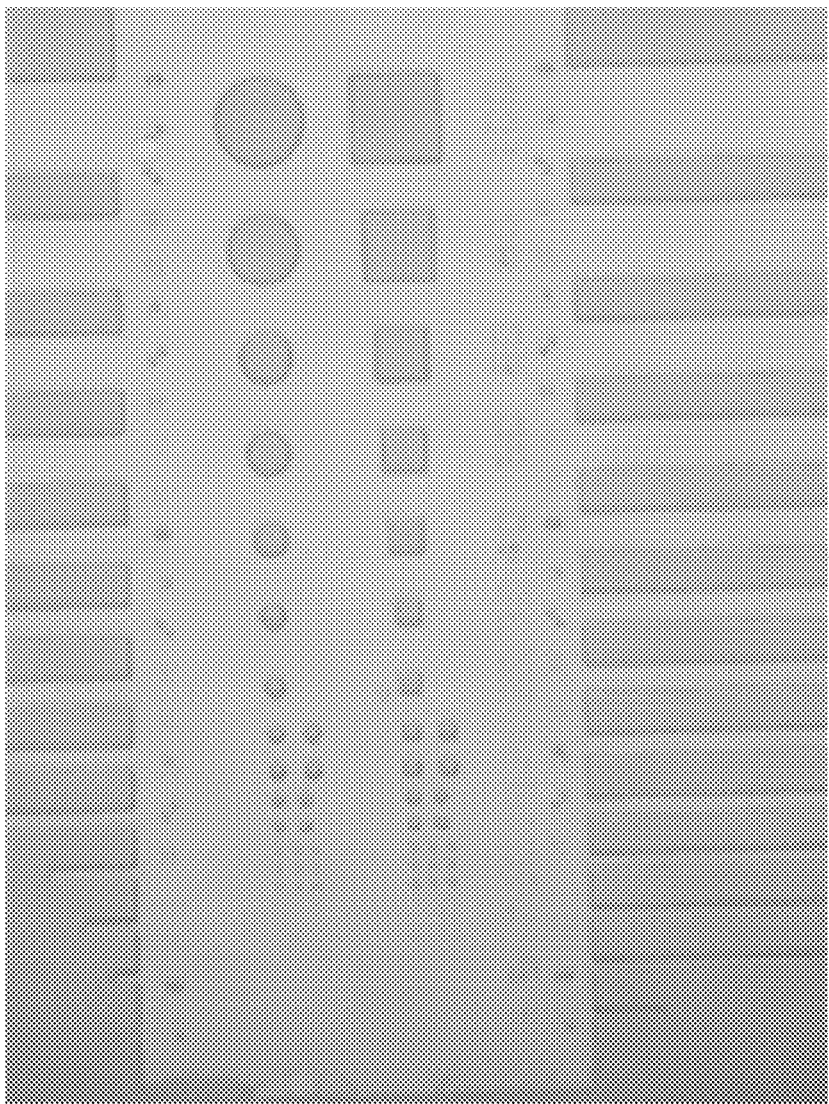
FIG. 4 shows an optical micrograph of a negative tone lithographic images of line and space pattern obtained from yet another composition embodiment of this invention.

FIG. 4 shows optical micrograph of the images formed from the composition of Example 12, which contained a polymer of Example 3 as polymer containing the repeat units of formula (I) and diallyl phthalate as another representative compound of formula (II). It is again evident from this micrograph that good negative tone images are observed with no film thickness loss after TMAH development. From FIG. 4 it is also evident that the minimum feature size of the images is at least about 15 micron.

Figure 5:
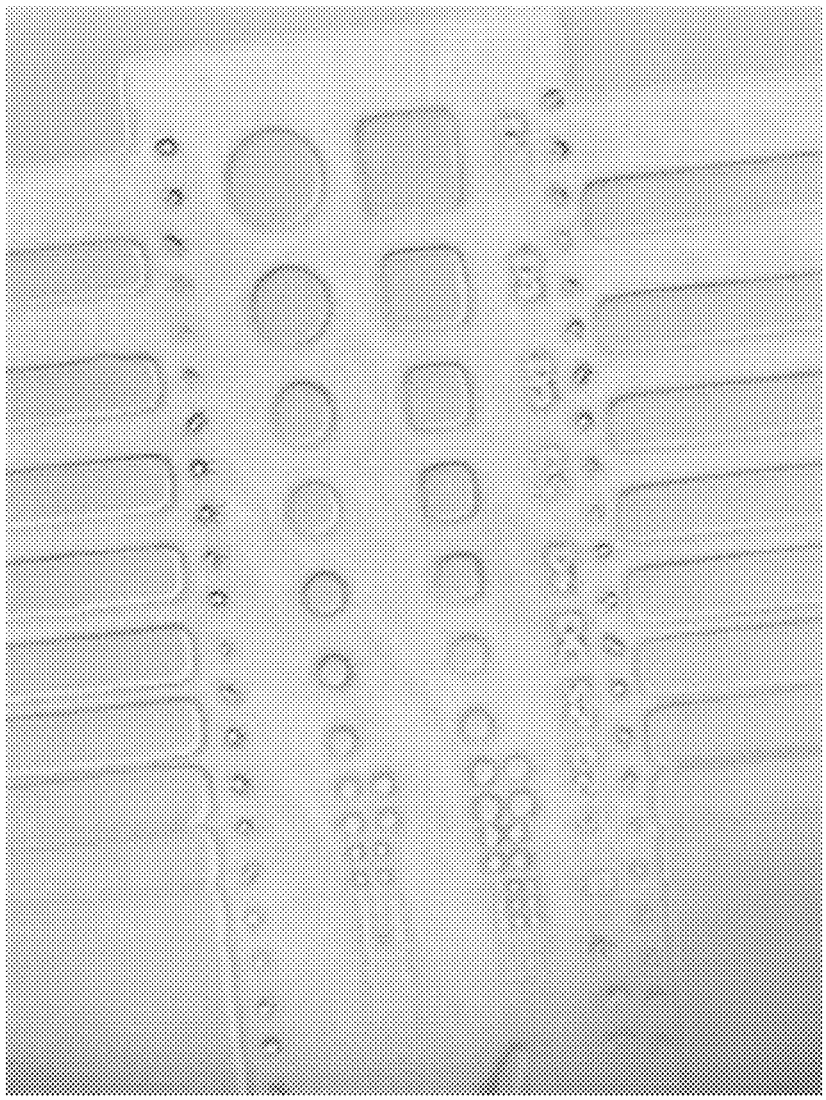
FIG. 5 shows an optical micrograph of a negative tone lithographic images of line and space pattern obtained from yet another composition embodiment of this invention.

FIG. 5 shows optical micrograph of the images formed from the composition of Example 13, which contained PHS as polymer containing the repeat units of formula (I) and NBEtOEtNB, a representative compound of formula (II). It is again evident from this micrograph that negative tone images are observed with some film thickness loss (28%) after TMAH development. From FIG. 5 it is also evident that the minimum feature size of the images is at least about 25 micron.

Figure 6:
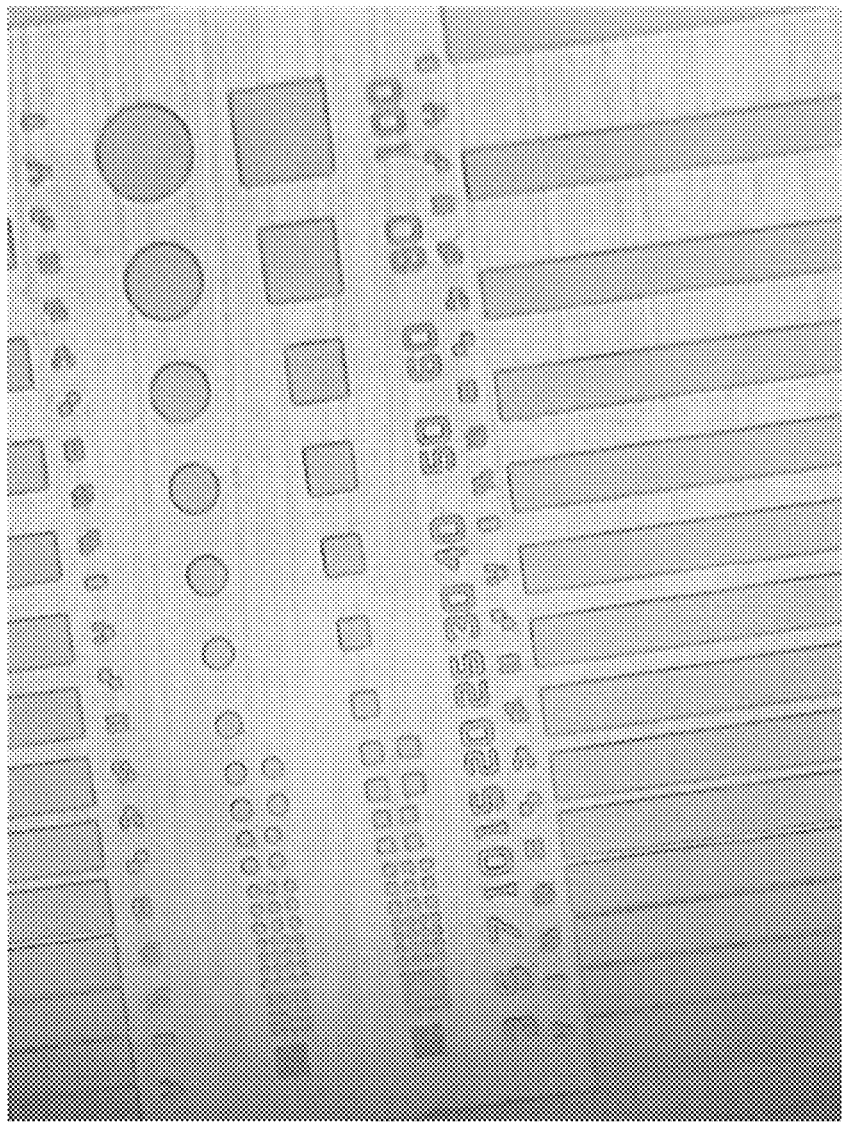
FIG. 6 shows an optical micrograph of a negative tone lithographic images of line and space pattern obtained from yet another composition embodiment of this invention.

Finally, FIG. 6 shows optical micrograph of the images formed from the composition of Example 14, which contained PHS as polymer containing the repeat units of formula (I) and NBPhOAc as another representative compound of formula (IV). It is again evident that negative tone images are observed with some film thickness loss (39%) after TMAH development. From FIG. 6 it is also evident that the minimum feature size of the images is at least about 3 micron.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A negative tone photoimagable composition comprising:
   a) a polymer having a pendent acidic group, which is selected from the group consisting of:
      i) a polymer of formula (Ia):

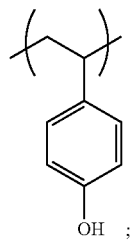

(Ia)

ii) a polymer comprising a repeating unit of formula (Ib) derived from a monomer of formula (IB):

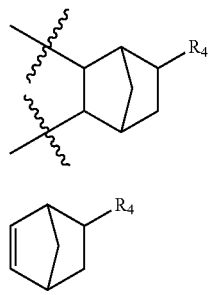

(Ib)

(IB)

wherein ⌇ represents a position at which the bonding takes place with another repeat unit;
   $R_4$ is selected front the group consisting of $-(CH_2)_y$, $-CO_2R_{4a}$, $-(CH_2)_y-Ar-OH$, $-(CH_2)_y-C(O)-Ar-OH$, $-(CH_2)_y-OC(O)-Ar-OH$, $-(CH_2)_y-C(O)O-Ar-OH$ and $-C(O)O(CH_2)_y-Ar-OH$, where each v is Independently an integer from 4) to 4, and $R_{4a}$ is hydrogen, Ar Is substituted or unsubstituted phenyl or napthenyl where substituents if present are selected from the group consisting of halogen, $(C_1-C_4)$alkyl, fluorinated or perfluorinated $(C_1-C_4)$alkyl, $(C_1-C_4)$alkoxy and fluorinated or perfluorinated $(C_1-C_4)$alkoxy; and
   iii) a polymer comprising one or more distinctive monomer repeating units of formula (Ic) derived from a monomer of formula (IC) and maleic anhydride-type repeating units of formulae (Id1) and (Id2) derived from a maleic anhydride monomer of formula (ID):

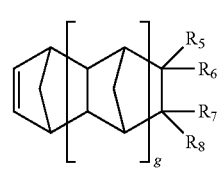

(IC)

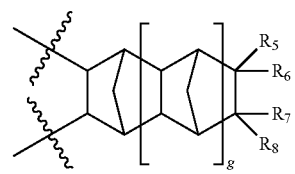

(Ic)

wherein:
⌇ represents a position at which the bonding takes place with another repeat unit;
g is 0;
$R_5$, $R_6$, $R_7$ and $R_8$ are the same or different and independently of each other selected from the group consisting of hydrogen, methyl, ethyl, a fluorinated or perflourinated methyl, ethyl and a linear or branched substituted or unsubstituted $(C_3-C_{25})$hydrocarbyl group;

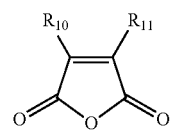

(ID)

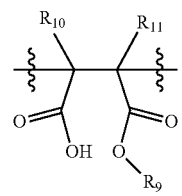

(Id1)

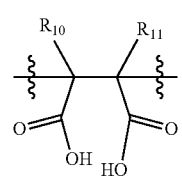

(Id2)

wherein:
⌇ represents a position at which the bonding takes place with another repeat unit;
$R_9$ is selected from the group consisting of methyl, ethyl, a fluorinated or perfluorinated methyl or ethyl a linear or branched $(C_3-C_9)$ hydrocarbyl and a linear or branched fluorinated or perfluorinated $(C_3-C_9)$ hydrocarbyl group;
$R_{10}$ and $R_{11}$ are the same or different and are selected from hydrogen, methyl and ethyl;

b) one or more olefinic functional group containing compound selected from the group consisting of:

i) a compound of formula (IIa):

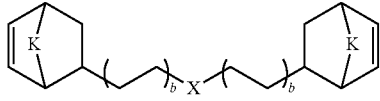

(IIa)

where
each b is independently an integer from 1 to 6;
K is CH$_2$; and
X is O;

ii) a compound of formula (IIb):

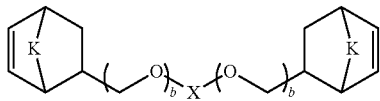

(IIb)

where
K is CH$_2$;
X is SiR$_2$R$_3$, —(CZ$_2$)$_b$— where Z is hydrogen, —C(O)—, —CH=CH— or —C≡C— where R$_2$ and R$_3$ are each independently methyl or ethyl; and
each b is independently an integer from 1 to 8;

ii) a compound of formula (IIc):

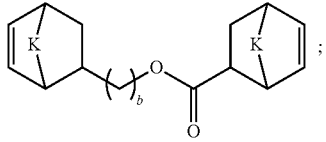

(IIc)

where
b is an integer from 1 to 6; and
K is CH$_2$ or CH$_2$—CH$_2$;

iv) a compound of formula (III) selected from the group consisting of:

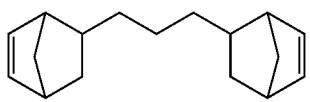 [SMILES: C1=CC2CC1CC2CCCC1CC2C=CC1C2]

1,3-di(bicyclo[2.2.1]hept-5-en-2-yl)propane;

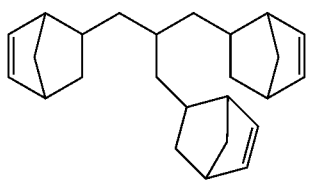 [SMILES: C1=CC2CC1CC2CC(CC1CC2C=CC1C2)CC1CC2C=CC1C2]

5,5'-(2-(bicyclo[2.2.1]hept-5-en-2-ylmethyl)propane-1,3-diyl)bis(bicyclo[2.2.1]hept-2-ene);

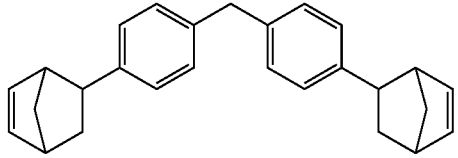 [SMILES: C1=CC2CC1CC2c1ccc(Cc2ccc(C3CC4C=CC3C4)cc2)cc1]

bis(4-bicyclo[2.2.1]hept-5-en-2-yl)phenyl)methane; and

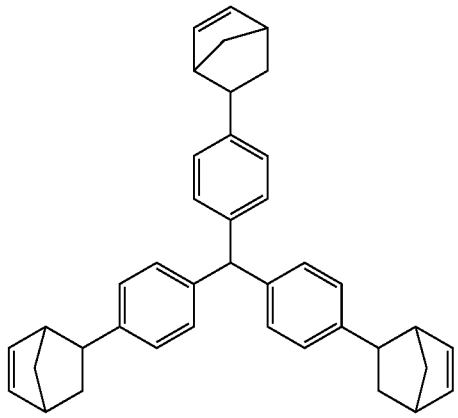 [SMILES: C1=CC2CC1CC2c1ccc(C(c2ccc(C3CC4C=CC3C4)cc2)c2ccc(C3CC4C=CC3C4)cc2)cc1]

tris(4-bicyclo[2.2.1]hept-5-en-2-yl)phenyl)methane; and v) a compound of formula (IV) selected from the group consisting of:

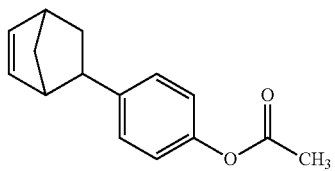

4-(bicyclo[2.2.1]hept-5-en-2-yl)phenyl acetate;

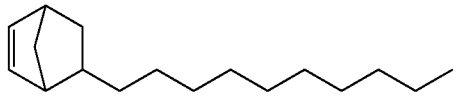 [SMILES: CCCCCCCCCCC1CC2C=CC1C2]

5-decylbicyclo[2.2.1]hept-2-ene;

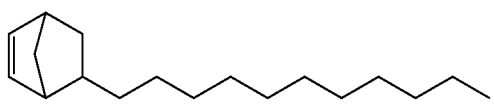 [SMILES: CCCCCCCCCCCC1CC2C=CC1C2]

5-undecylbicyclo[2.2.1]hept-2-ene;

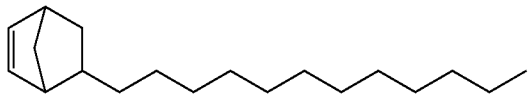 [SMILES: CCCCCCCCCCCCC1CC2C=CC1C2]

5-dodecylbicyclo[2.2.1]hept-2-ene;

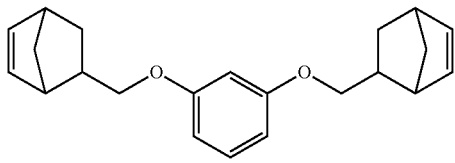 [SMILES: C1=CC2CC1CC2COc1cccc(OCC2CC3C=CC2C3)c1]

1,3-bis(bicyclo[2.2.1]hept-5-en-2-ylmethoxy)benzene;

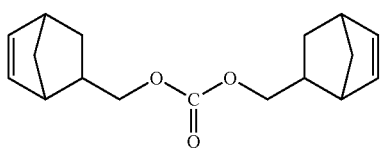 [SMILES: O=C(OCC1CC2C=CC1C2)OCC1CC2C=CC1C2]

bis(bicyclo[2.2.1]hept-en-2-ylmethyl) carbonate; and c) a photoacid generator.

2. The composition of claim 1 wherein the compound of formula (II) is selected from the group consisting of:

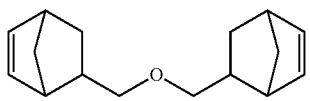 [SMILES: C1=CC2CC1CC2COCC1CC2C=CC1C2]

5,5'-(oxybis(methylene))bis(bicyclo[2.2.1]hept-2-ene);

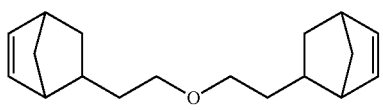 [SMILES: C1=CC2CC1CC2CCOCCC1CC2C=CC1C2]

5,5'-(oxybis(ethane-2,1-diyl))bis(bicyclo[2.2.1]hept-2-ene);

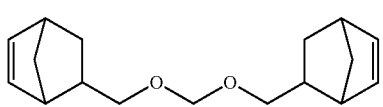 [SMILES: C1=CC2CC1CC2COCOCC1CC2C=CC1C2]

bis(bicyclo[2.2.1]hept-5-en-2-ylmethoxy)methane;

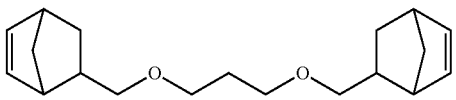 [SMILES: C1=CC2CC1CC2COCCCOCC1CC2C=CC1C2]

1,2-bis(bicyclo[2.2.1]hept-5-en-2-ylmethoxy)ethane;

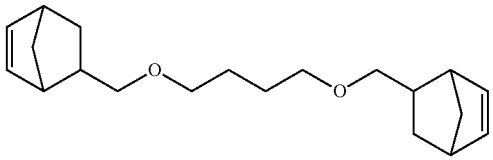 [SMILES: C1=CC2CC1CC2COCCCCOCC1CC2C=CC1C2]

1,3-bis(bicyclo[2.2.1]hept-5-en-2-ylmethoxy)propane;

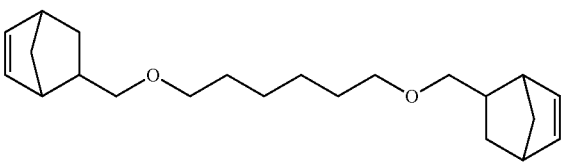 [SMILES: C1=CC2CC1CC2COCCCCCCOCC1CC2C=CC1C2]

1,4-bis(bicyclo[2.2.1]hept-5-en-2-ylmethoxy)butane;

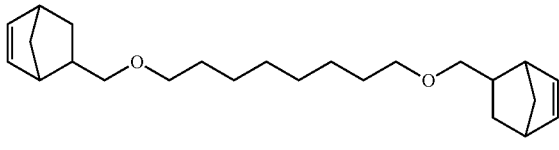 [SMILES: C1=CC2CC1CC2COCCCCCCCCOCC1CC2C=CC1C2]

1,6-bis(bicyclo[2.2.1]hept-5-en-2-ylmethoxy)hexane;

1,8-bis(bicyclo[2.2.1]hept-5-en-2-ylmethoxy)octane;

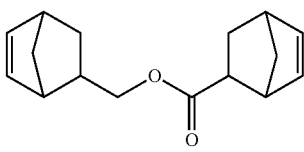 [SMILES: O=C(OCC1CC2C=CC1C2)C1CC2C=CC1C2]

bicyclo[2.2.1]hept-5-em-2-ylmethyl bicyclo[2.2.1]hept-5-ene-2-carboxylate; and

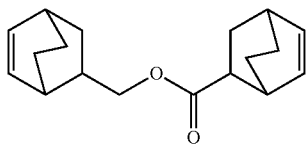 [SMILES: O=C(OCC1CC2C=CC1CC2)C1CC2C=CC1CC2]

bicyclo[2.2.2]oct-5-en-2-ylmethyl bicyclo[2.2.2]oct-5-ene-2-carboxylate.

3. The composition of claim 1 wherein the compound of formula (III) is selected from the group consisting of:

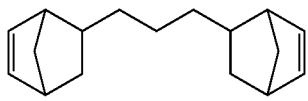 [SMILES: C1=CC2CC1CC2CCCC1CC2C=CC1C2]

1,3-di(bicyclo[2.2.1]]hept-5-en-2-yl)propane;

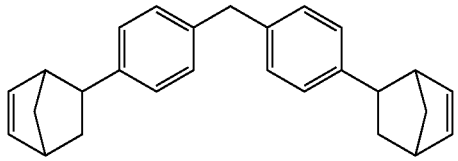 [SMILES: C1=CC2CC1CC2c1ccc(Cc2ccc(C3CC4C=CC3C4)cc2)cc1]

bis(4-(bicyclo[2.2.1]hept-5-en-2-yl)phenyl)methane; and

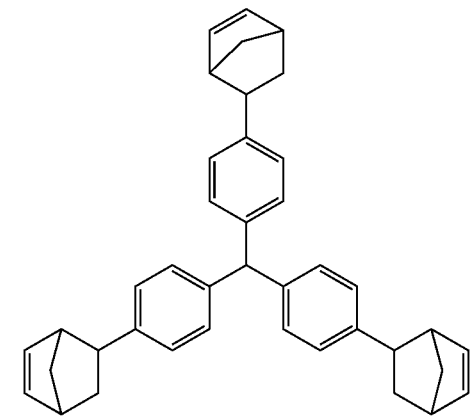 [SMILES: C1=CC2CC1CC2c1ccc(C(c2ccc(C3CC4C=CC3C4)cc2)c2ccc(C3CC4C=CC3C4)cc2)cc1]

tris(4-(bicyclo[2.2.1]hept-5-en-2-yl)phenyl)methane.

4. The composition of claim 1 wherein the compound of formula (IV) is selected from the group consisting of:

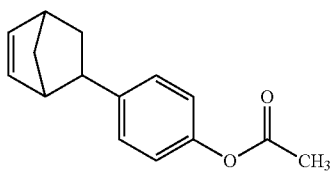

4-(bicyclo[2.2.1]]hept-5-en-2-yl)phenyl acetate;

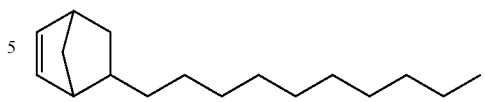

5-decylbicyclo[2.2.1]hept-2-ene; and

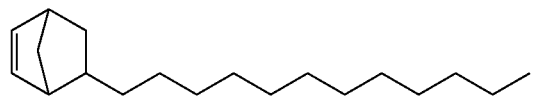 [SMILES: CCCCCCCCCCCCC1CC2C=CC1C2]

5-dodecylbicyclo[2.2.1]hept-2-ene.

5. The composition of claim 1 wherein the photoacid generator is selected from the group consisting of:

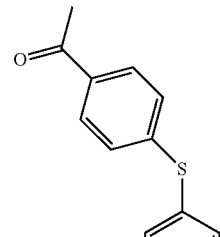

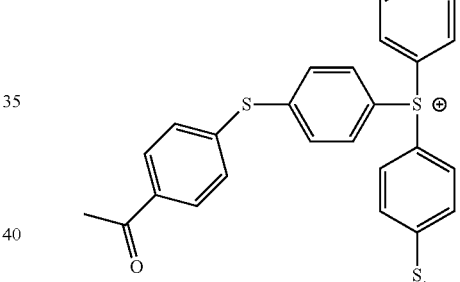

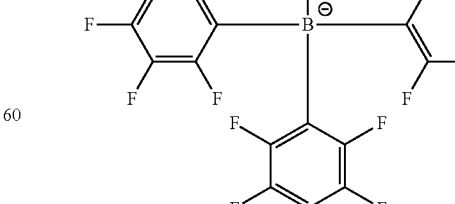

tris(4-((4-acetylphenyl)thio)phenyl)sulfonium tetrakis(perfluorophenyl)borate (Irgacure PAG 290);

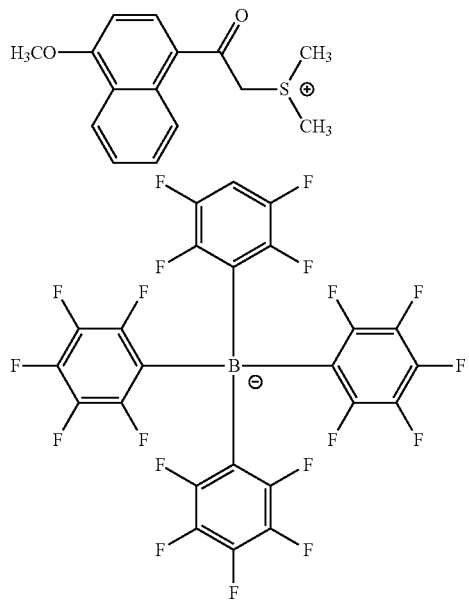

(2-(4-methoxynapthalen-1-yl)-2-oxoethyl)dimethylsulfonium tetrakis(perflourophenyl)borate (TAG 382);

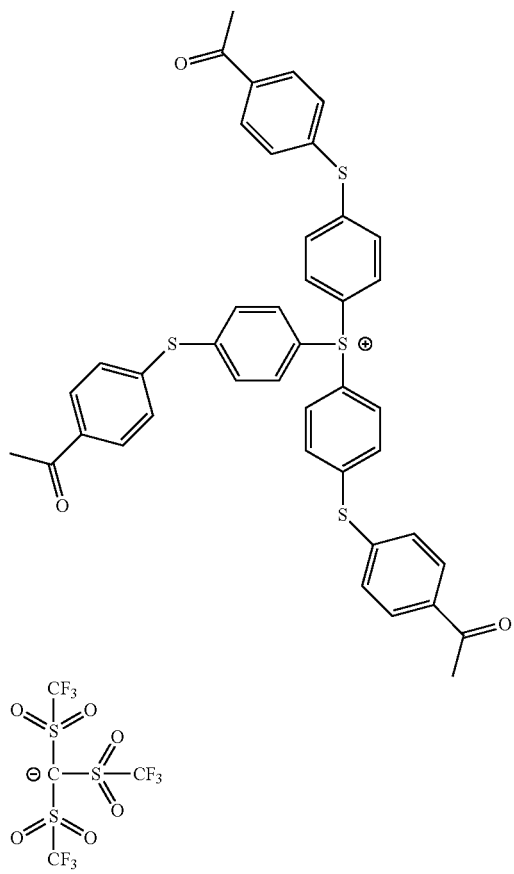

tris(4-((4-acetylphenyl)thio)phenyl)sulfonium tris((trifluoromethyl)sulfonyl)methanide;

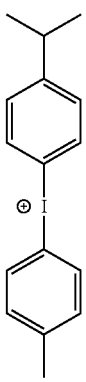

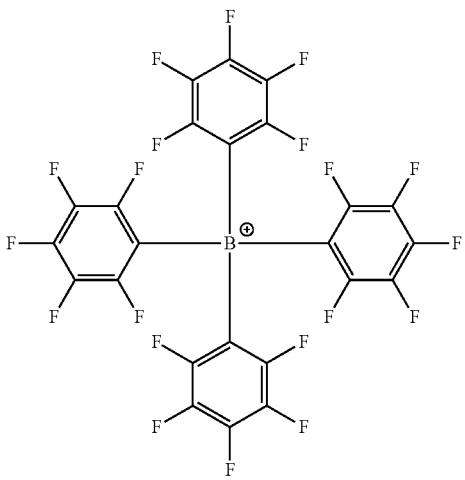

(4-ethylphenyl)(4-isopropylphenyl)iodonium tetrakis(perfluorophenyl)borate;

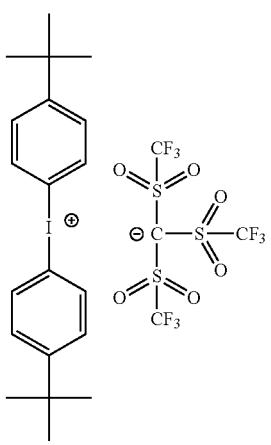 [SMILES: CC(C)(C)c1ccc([I+]c2ccc(C(C)(C)C)cc2)cc1 ; O=S(=O)([C-](S(=O)(=O)C(F)(F)F)S(=O)(=O)C(F)(F)F)C(F)(F)F]

di-(p-t-butylphenyl)iodonium tris(trifluoromethanesulfonyl)methanide and a mixture in any combination thereof.

6. The composition of claim 1 wherein said polymer is selected from the group consisting of:
  polyhydroxystyrene;
  a terpolymer derived from norbornenyl-2-trifluoromethyl-3,3,3-trifluoropropan-2-ol, 3-(bicyclo[2.2.1]hept-2-en-2-yl)propanoic acid, and trioxanonanenorbornene;
  a copolymer derived from maleic anhydride and norbornene which is ring opened with butanol; and
  a copolymer derived from norbornenyl-2-trifluoromethyl-3,3,3-trifluoropropan-2-ol and bicyclo[2.2.1]hept-5-en-2-ylmethanol.

7. The composition of claim 1 wherein the compound of formula (II), (III) or (IV) is selected from the group consisting of:
  5,5'-(oxybis(methylene))bis(bicyclo[2.2.1]]hept-2-ene);
  5,5'-(oxybis(ethane-2,1-diyl))bis(bicyclo[2.2.1]]hept-2-ene);
  bis(bicyclo[2.2.1]hept-5-en-2-ylmethoxy)methane;
  4-(bicyclo[2.2.1]hept-5-en-2-yl)phenyl acetate; and
  5-decylbicyclo[2.2.1]hept-2-ene.

8. The composition of claim 1 wherein the photoacid generator is selected from the group consisting of:
  tris(4-((4-acetylphenyl)thio)phenyl)sulfonium tetrakis(perfluorophenyl)borate;
  (4-ethylphenyl)(4-isopropylphenyl)iodonium tetrakis(perfluorophenyl)borate; and
  di-(p-t-butylphenyl)iodonium tris(trifluoromethanesulfonyl)methanide.

9. A negative tone photoimagable composition comprising:
  a) a polymer having a pendent acidic group, which is selected from the group consisting of:
    i) a polymer of formula (Ia):

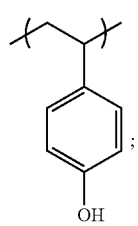

(Ia)

ii) a polymer comprising a repeating unit of formula (Ib) derived from a monomer of formula (IB):

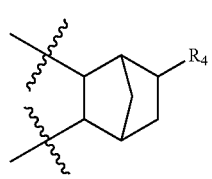

(Ib)

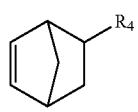

(IB)

wherein ⌇ represents a position at which the bonding takes place with another repeat unit;

$R_4$ is selected from the group consisting of —$(CH_2)_v$—$CO_2R_{4a}$, —$(CH_2)_v$—Ar—OH, —$(CH_2)_v$—C(O)—Ar—OH, —$(CH_2)_v$—OC(O)—Ar—OH, —$(CH_2)_v$—C(O)O—Ar—OH, and —C(O)O$(CH_2)_v$—Ar—OH, where each v is independently an integer from 0 to 4, and $R_{4a}$ is hydrogen, Ar is substituted or unsubstituted phenyl or naphthyl where substituents if present are selected from the group consisting of halogen, ($C_1$-$C_4$)alkyl, fluorinated or perfluorinated ($C_1$-$C_4$)alkyl, ($C_1$-$C_4$)alkoxy and fluorinated or perfluorinated ($C_1$-$C_4$)alkoxy; and iii) a polymer comprising one or more distinctive monomer repeating units of formula (Ic) derived from a monomer of formula (IC) and maleic anhydride-type repeating units of formulae (Id1) and (Id2) derived from a maleic anhydride monomer of formula (ID):

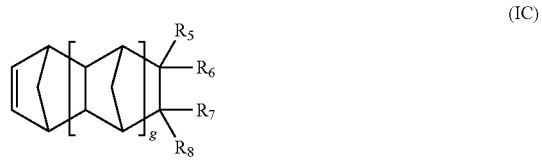

(IC)

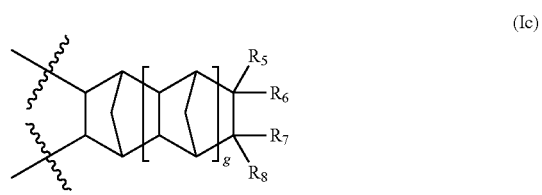

(Ic)

wherein:
  ⌇ represents a position at which the bonding takes place with another repeat unit;
  g is 0;
  $R_5$, $R_6$, $R_7$ and $R_8$ are the same or different and independently of each other selected from the group consisting of hydrogen, methyl, ethyl, a fluorinated or perfluorinated methyl, ethyl and a linear or branched substituted or unsubstituted ($C_3$-$C_{25}$)hydrocarbyl group;

(ID)

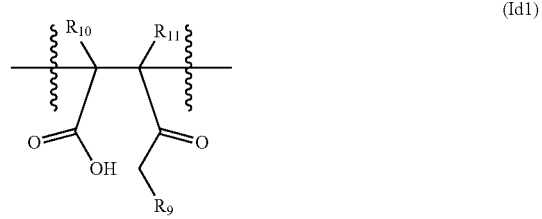

(Id1)

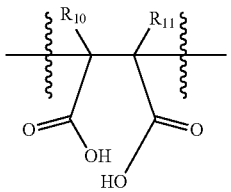

(Id2)

wherein:
⁓ represents a position at which the bonding takes place with another repeat unit;
$R_9$ is selected from the group consisting of methyl, ethyl, a fluorinated or perfluorinated methyl or ethyl, a linear or branched ($C_3$-$C_9$)hydrocarbyl and a linear or branched fluorinated or perfluorinated ($C_3$-$C_9$) hydrocarbyl group;
$R_{10}$ and $R_{11}$ are the same or different and are selected from hydrogen, methyl and ethyl;
b) a compound selected from the group consisting of:
5,5'-(oxybis(methylene))bis(bicyclo[2.2.1]hept-2-ene);
5,5'-(oxybis(ethane-2, 1-diyl))bis(bicyclo[2.2.1]hept-2-ene);
bis(bicyclo[2.2.1]hept-5-en-2-ylmethoxy)methane;
4-(bicyclo[2.2.1]hept-5-en-2-yl)phenyl acetate; and
5-decylbicyclo[2.2.1]hept-2-ene; and
c) a photoacid generator selected from the group consisting of:
tris(4-((4-acetylphenyl)thio)phenyl)sulfonium tetrakis(perfluorophenyl)borate;
(2-(4-methoxynaphthalen-1-yl)-2-oxoethyl)dimethylsulfonium tetrakis(perfluorophenyl)borate;
tris(4-((4-acetylphenyl)thio)phenyl)sulfonium tris((trifluoromethyl)sulfonyl)methanide;
(4-ethylphenyl)(4-isopropylphenyl)iodonium tetrakis(perfluorophenyl)borate; and
di-(p-t-butylphenyl)iodonium tris(trifluoromethanesulfonyl)methanide.

10. The composition of claim 9 further comprising one or more solvent selected from the group consisting of: N-methyl-2-pyrrolidone, γ-butyrolactone, N,N-dimethylacetamide, dimethylsulfoxide, diethyleneglycol dimethylether, diethyleneglycol diethylether, diethyleneglycol dibutylether, propyleneglycol monomethylether, dipropylene glycol monomethylether, propyleneglycol monomethylether acetate, methyl lactate, ethyl lactate, butyl lactate, methyl ethyl ketone, methyl amyl ketone, cyclohexanone, tetrahydrofuran, methyl-1,3-butyleneglycolacetate, 1,3-butyleneglycol-3-monomethylether, methyl pyruvate, ethyl pyruvate, methyl-3-methoxypropionate and a mixture in any combination thereof.

11. The composition of claim 9 further comprising one or more compounds selected from the group consisting of a phenolic resin, a leveling agent, an antioxidant, a flame retardant, a plasticizer, a silane coupling agent and a curing accelerator.

12. A semiconductor device comprising a laminated semiconductor element where said lamination consists of a composition according to claim 9.

13. A semiconductor device comprising one or more of a redistribution layer structure, a chip stack structure and a complementary metal oxide semiconductor image sensor dam structure, where said structure comprises a composition according to claim 9.

14. A film comprising the composition of claim 9.

15. A microelectronic or optoelectronic device comprising one or more of a redistribution layer structure, a chip-stack structure or a complementary metal oxide semiconductor image sensor dam structure, where said structure comprises a composition according to claim 9.

16. A method of forming a film for the fabrication of a microelectronic or optoelectronic device comprising:
coating a suitable substrate with a composition according to claim 9 to form a film;
patterning the film with a mask by exposing to a suitable radiation;
developing the film after exposure to form a photopattern; and
curing the film by heating to a suitable temperature.

17. The method of claim 16, where said developing is performed by a solvent developer, which is propyleneglycol monomethylether acetate.

18. The method of claim 16, where the substrate is first hardbaked before said curing at a temperature of from 130° C. to 160° C. for 20 minutes to 60 minutes.

* * * * *